(12) United States Patent
Zhang et al.

(10) Patent No.: US 10,772,218 B2
(45) Date of Patent: Sep. 8, 2020

(54) REACT-ON-DEMAND (ROD) FABRICATION METHOD FOR HIGH PERFORMANCE PRINTED ELECTRONICS

(71) Applicant: Tengyuan Zhang, London (CA)

(72) Inventors: Tengyuan Zhang, London (CA); Jun Yang, London (CA)

(73) Assignee: THE UNIVERSITY OF WESTERN ONTARIO, London, ON (CA)

( * ) Notice: Subject to any disclaimer, the term of this patent is extended or adjusted under 35 U.S.C. 154(b) by 0 days.

(21) Appl. No.: 15/723,887

(22) Filed: Oct. 3, 2017

(65) Prior Publication Data
US 2019/0208646 A1 Jul. 4, 2019

(51) Int. Cl.
| | |
|---|---|
| *H05K 3/10* | (2006.01) |
| *H05K 3/46* | (2006.01) |
| *H05K 1/02* | (2006.01) |
| *H05K 1/03* | (2006.01) |
| *H05K 1/09* | (2006.01) |
| *H05K 3/12* | (2006.01) |

(Continued)

(52) U.S. Cl.
CPC ........... *H05K 3/4644* (2013.01); *H05K 1/028* (2013.01); *H05K 1/0373* (2013.01); *H05K 1/092* (2013.01); *H05K 3/1208* (2013.01); *B05D 1/26* (2013.01); *B05D 3/002* (2013.01); *B05D 5/12* (2013.01); *B05D 7/50* (2013.01); *B05D 7/56* (2013.01); *H05K 1/0393* (2013.01); *H05K 3/125* (2013.01); *H05K 3/1216* (2013.01); *H05K 3/1275* (2013.01); *H05K 2201/0145* (2013.01); *H05K 2201/0154* (2013.01); *H05K 2203/0126* (2013.01); *H05K 2203/1157* (2013.01)

(58) Field of Classification Search
CPC .......... H05K 3/10; H05K 3/12; H05K 3/4644; H05K 3/1216; H05K 3/125; H05K 3/1275; H05K 1/092; B05D 1/26; B05D 3/002; B05D 5/12; B05D 7/50; B05D 7/56
USPC ...................................... 427/97.1, 97.6, 98.6
See application file for complete search history.

(56) References Cited

U.S. PATENT DOCUMENTS

| | | | | |
|---|---|---|---|---|
| 3,017,285 A | * | 1/1962 | Wainer ................... | C25D 11/18 148/251 |
| 9,329,177 B2 | * | 5/2016 | Chattopadhyay ...... | G01N 21/65 |

(Continued)

*Primary Examiner* — Brian K Talbot
(74) *Attorney, Agent, or Firm* — Hill & Schumacher

(57) ABSTRACT

A one-step react-on-demand (RoD) method for fabricating flexible circuits with ultra-low sheet resistance, enhanced safety and durability. With the special functionalized substrate, a real-time three-dimensional synthesize of silver plates in micro scale was triggered on-demand right beneath the tip in the water-swelled PVA coating, forming a three-dimensional metal-polymer (3DMP) hybrid structure of ~7 μm with one single stroke. The as-fabricated silver traces show an enhanced durability and ultralow sheet resistance down to 4 mΩ/sq which is by far the lowest sheet resistance reported in literatures achieved by direct writing. Meanwhile, PVA seal small particles inside the film, adding additional safety to this technology. Since neither nanomaterials nor a harsh fabrication environment are required, the proposed method remains low-cost, user friendly and accessible to end-users. the RoD approach can be extended to various printing systems, offering a particle-free, sintering-free solution for high resolution, high speed production of flexible electronics.

11 Claims, 27 Drawing Sheets

(51) Int. Cl.
*B05D 1/26* (2006.01)
*B05D 5/12* (2006.01)
*B05D 7/00* (2006.01)
*B05D 3/00* (2006.01)

(56) References Cited

U.S. PATENT DOCUMENTS

| | | | | |
|---|---|---|---|---|
| 2004/0086646 | A1* | 5/2004 | Brandes | C23C 18/1844 |
| | | | | 427/304 |
| 2005/0006339 | A1* | 1/2005 | Mardilovich | C23C 1/1601 |
| | | | | 216/39 |
| 2008/0178761 | A1* | 7/2008 | Tomotake | C23C 18/06 |
| | | | | 106/1.26 |
| 2009/0304911 | A1* | 12/2009 | Lin | H05K 3/105 |
| | | | | 427/97.4 |
| 2018/0002814 | A1* | 1/2018 | Jaworowski | C23C 22/73 |

\* cited by examiner

REACT-ON-DEMAND (ROD) FABRICATION METHOD FOR HIGH PERFORMANCE PRINTED ELECTRONICS

BACKGROUND OF THE INVENTION

Field of the Invention

This invention is related to printed electronics, more particularly related to the fabrication of high performance circuits with ultra-low sheet resistance.

Description of the Prior Art

As a fast prototyping technique, direct writing of flexible electronics is gaining popularity for its low-cost, simplicity, ultrahigh portability and ease of use. However, the latest hand-written circuits reported either have relative low conductivity or require additional post-treatment, keeping this emerging technology away from end-users. Here, we proposed a one-step react-on-demand (RoD) method for fabricating flexible circuits with ultra-low sheet resistance, enhanced safety and durability. With the special functionalized substrate, a real-time three-dimensional synthesize of silver plates in micro scale was triggered on-demand right beneath the tip in the water-swelled PVA coating, forming a three-dimensional metal-polymer (3DMP) hybrid structure of ~7 μm with one single stroke. The as-fabricated silver traces show an enhanced durability and ultralow sheet resistance down to 4 mΩ/sq which is by far the lowest sheet resistance reported in literatures achieved by direct writing. Meanwhile, PVA seal small particles inside the film, adding additional safety to this technology. Since neither nanomaterials nor a harsh fabrication environment are required, the proposed method remains low-cost, user friendly and accessible to end-users. With little effort, the RoD approach can be extended to various printing systems, offering a particle-free, sintering-free solution for high resolution, high speed production of flexible electronics. Printed flexible electronics technology, which takes advantage of the existing manufacturing capabilities of the graphics industry to produce circuitries at significantly lower cost and with high speed, has gained remarkable attention in the last decade. This vibrant new technology is transforming the electronics industry by replacing expensive electronic components, devices and even systems fabricated with traditional manufacturing methods. Much research has been carried out on flexible substrates and many new applications have been explored, such as thin-film transistors, flexible displays, flexible energy-storage devices, radio frequency identification (RFID) tags, medical and cosmetic devices. One can foresee a world full of flexible, wearable, and stretchable devices developed by this emerging technology.

Recently, various printing techniques have been demonstrated to fabricate flexible electronics, such as inkjet printing, gravure printing, screen printing, transfer printing, extrusion printing, laser printing and aerosol jet printing. In addition, based on the newly developed integrated 3D printing system, printed electronics can be fabricated in a three-dimensional manner, exhibiting huge potential for the manufacturing of devices that require arbitrary constructs and unique functions. However, these techniques are usually inaccessible to general users, due to the inevitable enrollment of special expensive equipment, high energy consumption, intractable troubleshooting process, harsh requirement of the ink and extensive need for professional skills.

As an alternative technique, direct pen writing of flexible electronics is gaining popularity for its low-cost, simplicity, ultrahigh portability and ease of use. Despite lower resolution and accuracy, pen-writing has no harsh requirement for the ink and can be easily operated without professional skills. Circuit prototypes can be rapidly fabricated on-site without use of sophisticated equipment, affording great convenience for practical use by end-users and in areas with limited resources. Various writing instruments have been recently adopted to write electronics directly, such as with ball pen, pencil, fountain pen, brush pen and marker pen. Most of the work has been focused on the direct writing of conductive inks, including metal nanoparticles inks, carbon-based inks, conductive polymer inks and liquid metals. Among these, metal nanoparticle inks hold the advantage of relatively high conductivity but are subjected to high cost (compared to metal salt) due to the professional equipment and strict synthesis process needed during production. Such metallic inks require extensive post-treatment, such as heating, laser annealing, hot pressing and plasma, to form patterns with good conductivity. For instance, after the writing of silver nanoparticle inks, an extra time-consuming sintering step of ~2 hour is needed to further enhance its conductivity, where the need for high temperatures (120° C.~160° C.) further complicate the whole fabrication process. Though the sheet resistance of the written trace can be greatly reduced by post-treatment to 50 mΩ/sq, it is still much higher than that generated by a wet chemistry process due to the limited metal loading in the ink.

Targeted at end-users with no professional skills and point-of-care applications, safety becomes one of the most important concerns for handwritten electronics. The written circuits are expected to be handled and touched by users during normal use. Thus, if the circuits are not properly treated, the exposed and unsealed nanoparticles will adhere to the skin. Metallic inks usually contain large numbers of nanoparticles smaller than 50 nm; at this scale, these nanoparticles can permeate skin and enter the bloodstream. Many reports have recently addressed the protentional toxicity of metal nanoparticles in the human body, thus it is crucial to develop new techniques to enhance the safety of this emerging technology.

SUMMARY

The present disclosure provides a react-on-demand (RoD) method of fabricating a three-dimensional electrically conductive hybrid metal-polymer structure on a substrate, the method comprising:

(i) coating the substrate with an ink-absorption coating to form an ink absorption layer on the substrate, followed by (ii) coating the substrate with polyvinyl alcohol (PVA) solution to form a PVA layer having PVA polymers on the ink absorption layer, followed by (iii) functionalizing the PVA layer with a first solvent containing a reducing agent and evaporating the first solvent to induce formation of crystals of the reducing agent located in between polymer chains of the PVA polymers as well as on the surface of the PVA layer, followed by (iv) printing or writing a second solvent containing water and a metal salt onto the PVA layer wherein the second solvent dissolves the reducing agent and at the same time the reducing agent reduces the metal salt to produce metal particles to form a three-dimensional electrically conductive hybrid metal-polymer structure in which the metal particles are located on the surface of the PVA layer as well as in between the polymer chains in an interior of the PVA layer.

The substrate may be a flexible substrate and the substrate is any one of polyimide (PI), polyethylene terephthalate film (PET), polyethylenimine (PEI), polydimethylsiloxane (PDMS) and paper.

The substrate may be a rigid substrate and the substrate is any one of FR-4, Polyvinyl chloride (PVC), acrylonitrile butadiene styrene (ABS) and polylactic acid (PLA).

The PVA polymers of the PVA layer may have a molecular weight in a range from 40,000 g/mol to 100,000 g/mol.

The concentration of the PVA solution may be in a range from 10% to 30 w/v % in water.

The coating method of coating with said ink-absorption coating and with said polyvinyl alcohol (PVA) solution is any one of spin coating, dip-coating, spray coating and printing.

The reducing agent may be one of ascorbic acid and glucose.

In the first solvent the concentration of the reducing agent may be in a range from 20% to 30% w/v %.

The printing method may be any one of inkjet printing, gravure printing, off-set printing, aerosol jet printing and screen printing.

The metal salt may be silver nitrate.

The concentration of the metal salt may be in a range from 0.2 g/mL to 2.0 g/mL.

The present disclosure provides an object manufactured according the method described above.

It is worth noting that although the direct pen writing process has proven to be rapid, simple and portable, there are still ways to go before it is an ideal easy, safe and cost-effective method for fabricating electronics, considering all the aforementioned challenges and limitations. In this invention, we propose a one-step react-on-demand method for fabricating flexible circuits with ultra-low sheet resistance, enhanced safety and durability to accomplish this goal. A none-toxic vitamin C functionalized polyvinyl alcohol (PVA) coating was introduced as the media for real-time in-situ three-dimensional reduction of silver salt ink at room temperature. Utilizing the water-swellable property of PVA, the reduction of silver takes place immediately on the surface as well as in between the polymer chains, when the ink is written onto the substrate at room temperature. A highly conductive three-dimensional metal-polymer (3DMP) hybrid structure of about 7 μm thickness can be generated in a few seconds after the evaporation of the solvent. The PVA not only serves as the reaction media for the in-situ reduction of silver, but also serves to bind and protect the materials to seal all small particles inside the film, enhancing its safety and durability. Thanks to the high solubility of silver nitrate in water and the unique 3DMP structure, the as-fabricated silver traces show an ultralow sheet resistance of down to 4 mΩ/sq without post-treatment, which is far better than any other method described in the literature thus far. Since no nanomaterials, post-treatment or harsh experimental conditions were required, the proposed method proves to be a truly cost-effective, simple and safe alternative to current methods. We believed that this work could bring the emerging handwritten electronics technology one step closer to those end-users who require performance, safety, ease-of-use and cost-efficiency at the same time. With little effort, the RoD approach can be extended to various printing systems, offering a particle-free, sintering-free solution for high resolution, high speed production of flexible functional circuits and devices.

BRIEF DESCRIPTION OF DRAWINGS

FIG. 1A: The ink absorption layer and a thin layer of PVA polymer are brush coated onto PET substrate one by one.

FIG. 1B: Spin coating saturated ascorbic acid (Vitamin C) solution to functionalize the PVA coating.

FIG. 1C: Direct writing or printing of silver nitrate solution onto the coated layer, generating a metal-polymer highly conductive structure.

FIG. 2A to 2C: SEM images of the cross-section of

FIG. 2A: the multi-coated PET substrate before writing or printing silver nitrate ink;

FIG. 2B: zoomed-in part of the squared area in FIG. 2A;

FIG. 2C: after react-on-demand generation of silver-polymer highly conductive layer.

FIGS. 4A to 4E: SEM images of the surface morphologies of single-stroke samples written with different silver nitrate concentration of:

FIG. 4A: 0.2 g/mL;
FIG. 4B: 0.6 g/mL;
FIG. 4C: 0.8 g/mL;
FIG. 4D: 1.2 g/mL;
FIG. 4E: 1.6 g/mL.

FIG. 4G: 0.6 g/mL;
FIG. 4H: 0.8 g/mL;
FIG. 4I: 1.2 g/mL;
FIG. 4J: 1.6 g/mL.

FIGS. 5A to 5C: X-ray photoelectron spectroscopy (XPS) spectrums of:

FIG. 5A: Ag3d;
FIG. 5B: Ag MNN;
FIG. 5C: O1s from traces written with 1.2 g/mL silver nitrate ink on un-functionalized coatings.

FIGS. 5D to 5F: XPS spectrums of

FIG. 5D: Ag3d;
FIG. 5E: Ag MNN;
FIG. 5F: O1s from traces written with 1.2 g/mL silver nitrate ink on Vc functionalized coatings.

FIG. 6E: double-stroke trace as a function of bend rate (ΔL/L0%);
FIG. 6F: single-stroke trace
and
FIG. 6G: double-stroke trace as a function of bend cycles;
FIG. 6H: single-stroke trace
and
FIG. 6I: double-stroke trace as a function of time.

DETAILED DESCRIPTION

Figure 1A:
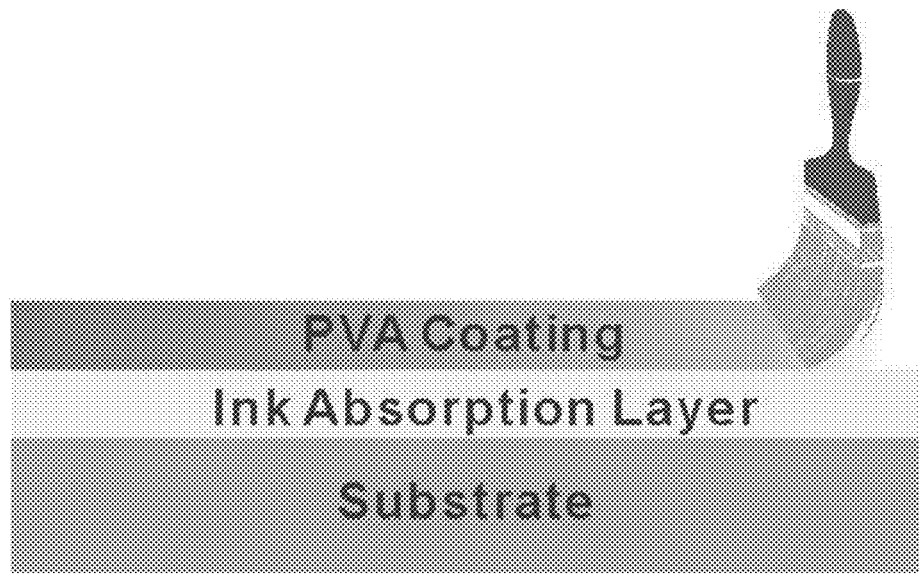
FIG. 1A to 1C. Fabrication process of the react-on-demand method.
Figure 1B:
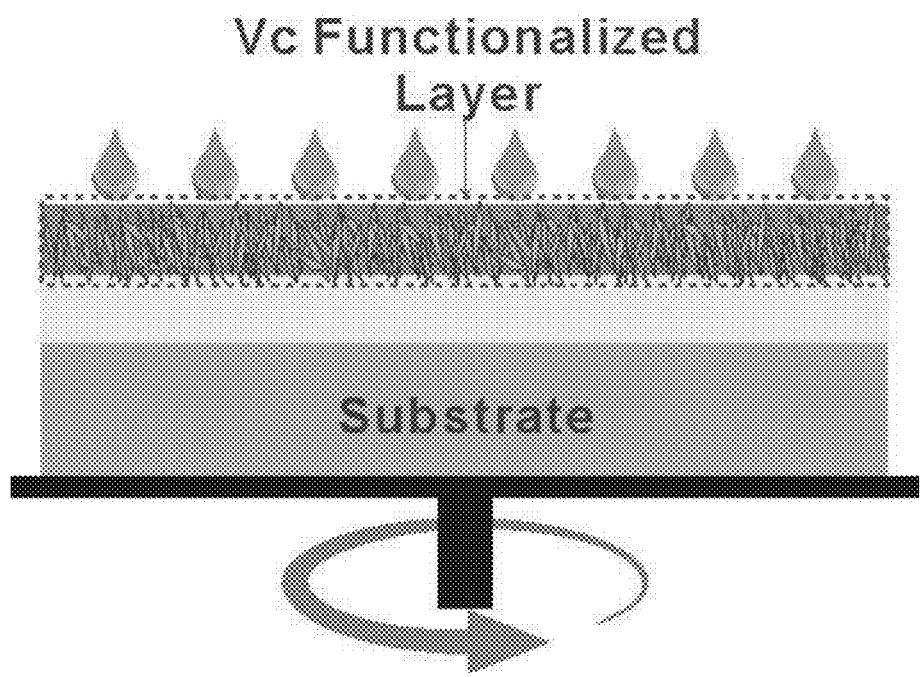
Figure 1C:
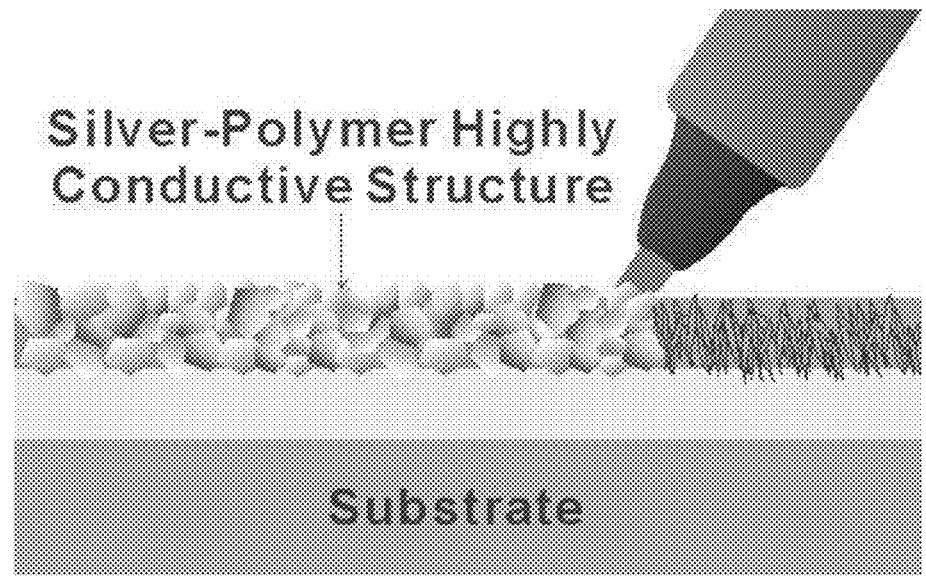

Extensive work has been carried out to synthesize silver nanoparticles with controllable shape, size and properties in recent years. The development of a biocompatible and environmental friendly synthesis process brings popularity to many eco-friendly reducing agents such as ascorbic acid, sodium citrate and tannic acid. As a biologically originated compound, ascorbic acid (Vitamin C) was chosen as the reductant in this work for its powerful reducing property and good stability in cool and dry air. The fabrication of traditional metal nanoparticles inks involves large amounts of capping agents, stabilizers and/or dispersing agents to control the size, shape of the particles and prevent agglomeration. To achieve a good dispersibility as well as a relatively high loading (~50%) of silver in the solvent, the size distribution peak of the silver nanoparticles needs to be smaller than 100 nm for low-viscosity inkjet ink. However, smaller particle size typically means worse conductivity, since a higher ratio of additives will wrap and/or bond to the surface of the nanoparticles, preventing the nanoparticles from contacting with one another when the ink dries. A post-sintering process can help to remove these additives using a high energy method, but the equipment needed for post-treatment is inaccessible to end-users, which consequently limits its application to handwritten electronics. Thus, we proposed a react-on-demand (RoD) method, which offers a unique approach to fabricate high performance flexible devices by on-site synthesis of highly conductive silver plates without any additives. FIGS. 1A to 1C shows the general idea and fabrication process of the RoD method.

Pristine polyethylene terephthalate (PET) substrate was washed and brush-coated with multiple materials (FIG. 1A) The first layer of coating is a commercially available waterproof ink absorption material. This kind of coating can absorb excessive solvent, which in turn reduces the drying time and helps with the ink bleeding issue. A second layer of polyvinyl alcohol (PVA) coating was then introduced as the reaction media for the RoD method. As a water-soluble synthetic polymer, PVA is widely used in textiles, paper making and a variety of coatings due to its cheap price, non-toxicity and good flexibility. PVA is only soluble in hot water (>80° C.), and will swell if the water is at room temperature (~20° C.). The mechanism of the swelling of PVA has been well studied and has been widely used in drug delivery applications in the past decades. Briefly, small solvent molecules, like water, will diffuse into the partially cross-linked polymers in a short period of time and reside in between polymer chains. Utilizing the water-swelling property of PVA, we embedded the reducing agent into the PVA film by spin coating the saturated ascorbic acid solution, as shown in FIG. 1B. As the solvent evaporates, the ascorbic acid will crystallize and precipitate, forming small reducing crystals in between the PVA polymer chains as well as on the surface. The PVA film seals the Vc crystals when the solvent dries, and protect them from being oxidized in air. The functionalized film retains good reducing ability and function after three months of storage in a dark and dry environment.

Figure 2A:
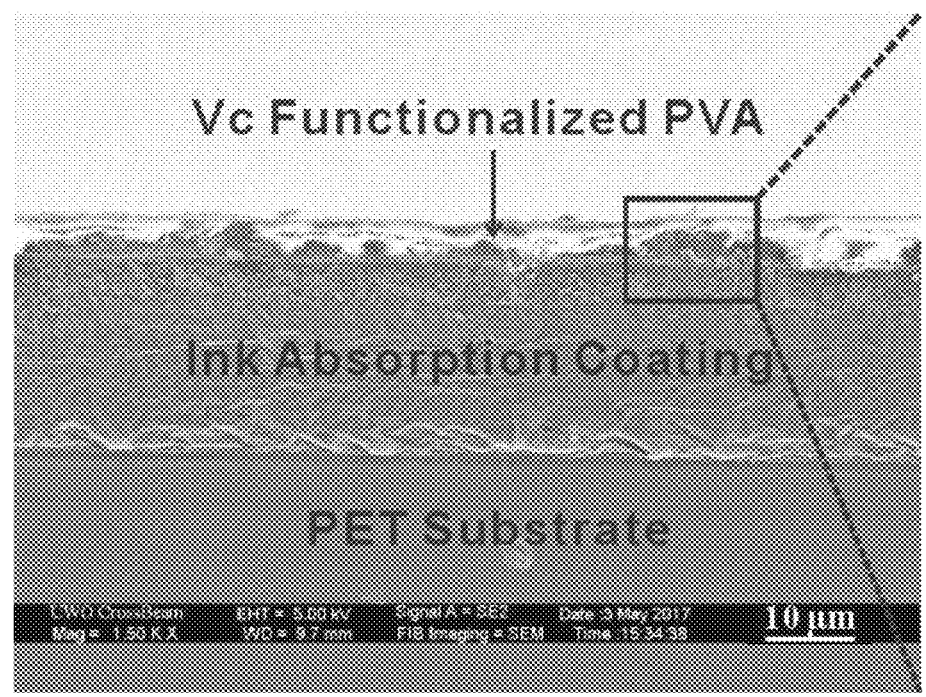
Figure 2B:
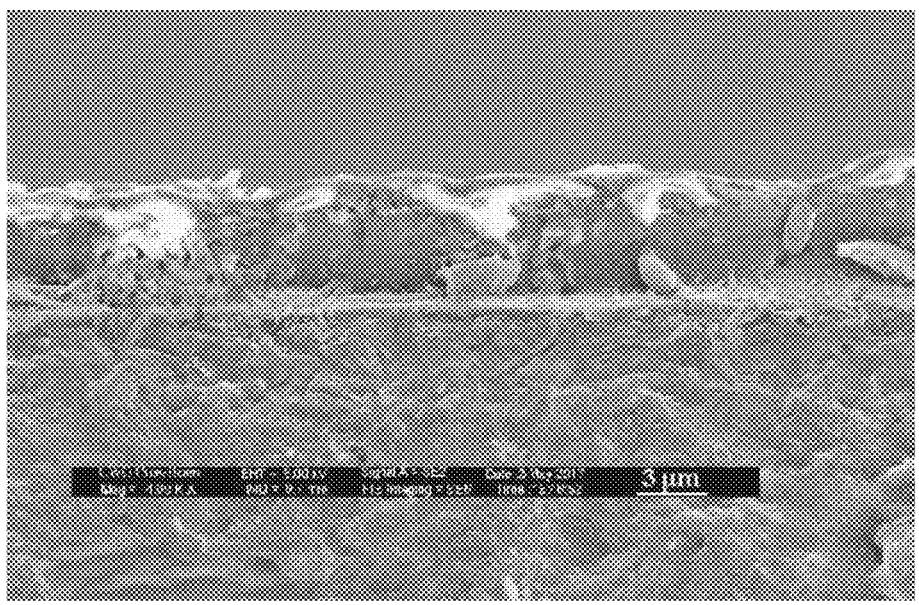
Figure 2C:
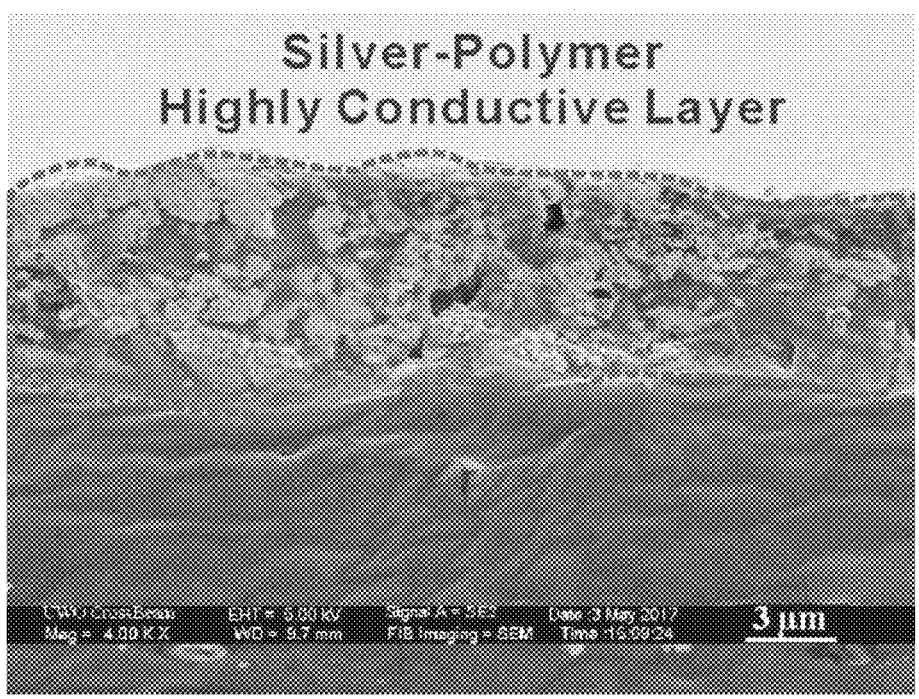

The cross-section of the finalized coating is shown in FIG. 2A, and FIG. 2B is a zoom-in of the area marked with a box in FIG. 2A. From the SEM images, we see that the first layer of coating has a thickness of about 20 μm for efficient absorption of the solvent. Right above it, the PVA forms a thinner layer (~3 μm) of coating with embedded Vc crystal. In FIG. 2B, some large Vc crystals are observable at the interface of the two layers, illustrating a successful functionalization of the coating. Silver nitrate was chosen as the metal precursor for its ultra-high solubility in water. The solubility of silver nitrate in water can reach 256 g/100 mL at room temperature (25° C.). This gives a maximum silver content loading of more than 120% (w/v), which is much higher than any commercial available silver ink. High solubility facilitates high loading of metal slat without increasing the amount of ink, and further contributes to the high metal content in written traces after the on-site RoD reduction. Aqueous silver nitrate solution was filled into a liquid ink marker with a chisel tip. This type of marker is compatible with low-viscosity ink, and the chisel tip allows users to write traces of different widths with ease, offering excellent user experience. When the ink flows out of the tip onto the functionalized coating, the three-dimensional reduction of silver takes place in a few seconds as the PVA layer swells under the action of water. Silver ions diffuse with water molecules into the PVA film, where the ascorbic acid is dissolved at the same time, forming a sectional solution system to trigger the RoD of silver reduction. Thanks to the water-swelling property of PVA, this reaction takes place both on the surface and inside the film between polymer chains. As the solvent evaporates, a three-dimensional metal-polymer highly conductive structure will form in a few seconds, as shown in FIG. 1C. The cross-section of the generated 3DMP structure is shown in FIG. 2C through SEM, which displays a sample written with 1.2 g/mL silver nitrate ink in one stroke. A silver-polymer hybrid structure (dotted box area) with a thickness of ~7 μm can be clearly observed from the picture. The 3DMP structure is much thicker than that of the functionalized PVA coating itself, which can be explained by the newly generated silver metal between the polymer chains.

Figure 3A:
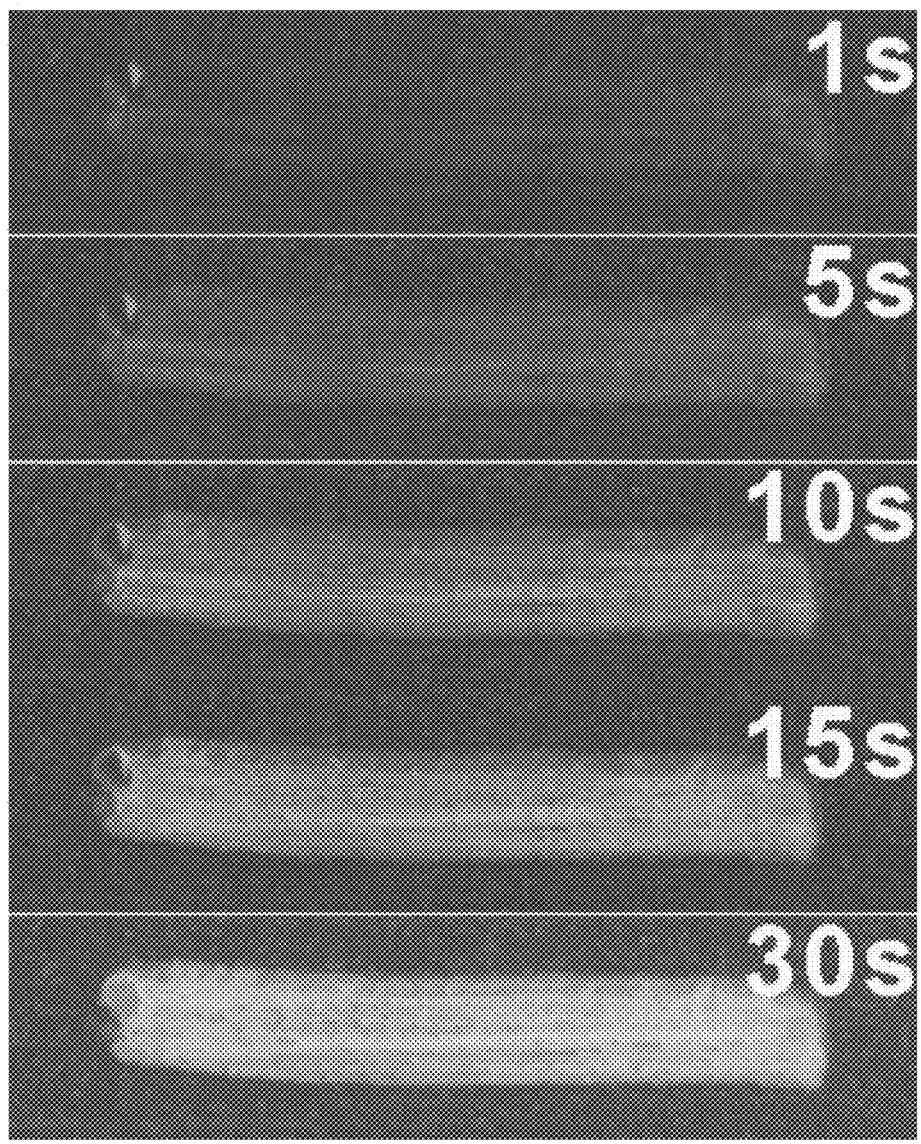
FIG. 3A: Optical images showing the surface of the substrate after direct-writing with 1.2 g/mL silver nitrate ink at 1 s, 5 s, 10 s, 15 s and 30 s.

FIG. 3A shows the silver reduction process using the proposed RoD method from 0 to 30 seconds after reaction at room temperature. The trace was written with 1.2 g/mL silver nitrate ink and the photos were taken under the same lighting conditions. For the first 5 seconds, the silver trace is barely seen. During this period, the water molecules and silver ions are absorbed by the PVA film, while at the same time, the ascorbic acid molecules embedded in the film are dissolved, forming a sectional reducing solution which reduces the silver ions immediately.

The above process continues, and more and more silver ions are reduced; the generated silver plates/particles tend to grow larger since no capping agent is used. After 10 seconds, the trace shows a silver metallic color with a clear edge.

After 30 seconds, a solid silver trace with ultra-low sheet resistance is formed. The silver generated by the RoD method is well bonded and sealed by the PVA film, and resists erosion when rubbed by fingers.

Figure 3B:
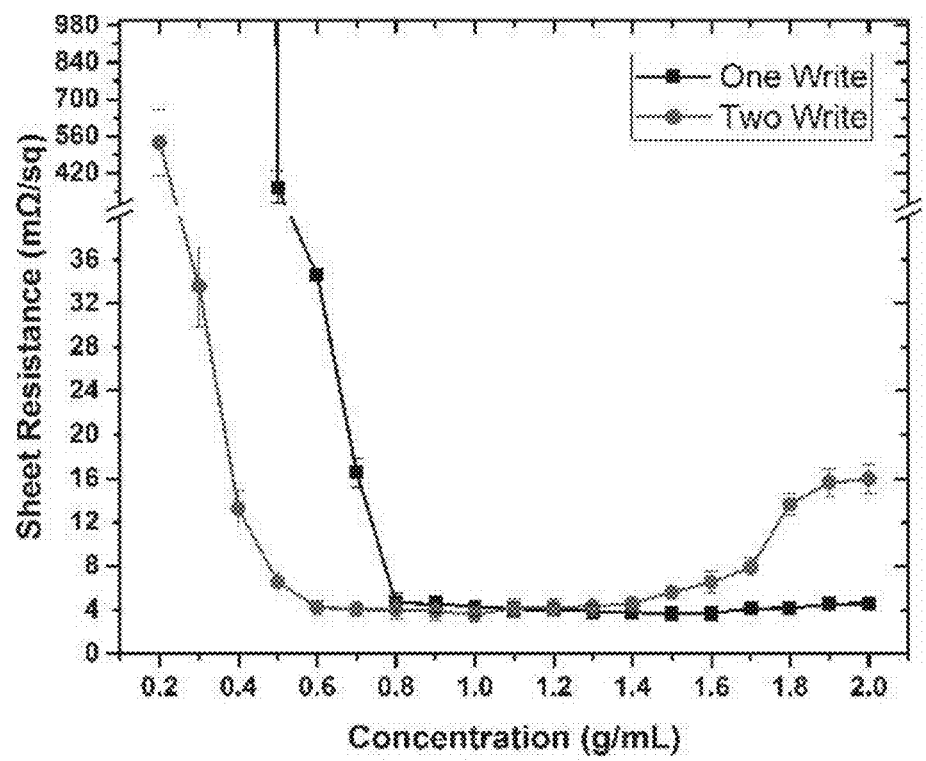
FIG. 3B: Graph showing the change of sheet resistance with different silver nitrate concentration. The black line with square symbol corresponds to traces written with single stroke; the red line with circle symbol corresponds to traces written with double strokes.

For the silver nanoparticle based ink, the silver content loading plays a critical role in the conductivity of the final product. This is also true in the RoD method. To investigate the relationship between the silver nitrate concentration and sheet resistance of the written traces, we prepared inks with different concentrations ranging from 0.2 g/mL to 2.0 g/mL. The final resistance of the written traces is also affected by the amount of ink, which can be determined by the number of repeats. Thus, two groups of experiments were conducted; one without repeat writing (single-stroke) and the other with one repeat (double-stroke). The results are shown in FIG. 3B. For the one-write group, the sheet resistance initially drops drastically with increase in concentration and starts showing good conductivity when the silver slat load reaches 0.6 g/mL. At this point, it has a sheet resistance of ~35 mΩ/sq, which is better than most inkjet printed circuits with silver inks. Beyond 0.8 g/mL (~4.70 mΩ/sq), the decrease in sheet resistance slows down significantly, which is attributed to the limited loading of ascorbic acid in the PVA film. The lowest sheet resistance of ~3.66 mΩ/sq is observed at 1.6 g/mL for the one-write group. Interestingly, the sheet resistance begins to increase slightly when the concentration of silver nitrate is higher than 1.6 g/mL. At this point, there is not enough ascorbic acid in the PVA film to reduce all the silver nitrate, and the non-reduced silver nitrate embeds in the PVA film, preventing the conductive silver plates/particles from contacting with each other and thus increasing the sheet resistance. A similar phenomenon is also observed in the double-stroke group. The double-stroke traces show its lowest sheet resistance of 3.62 mΩ/sq at a silver nitrate concentration of 1.0 g/mL, which is very close to what we achieved (3.66 mΩ/sq) with 1.6 g/mL ink by single stroke due to the limiting amount of ascorbic acid in PVA film. The sheet resistance then starts to increase at a faster rate than the single-stroke group. This was expected as more ink was written onto the substrate. To have a more in-depth understanding of the conductivity change, the morphology of the silver trace was investigated with field emission scanning electron microscopy (FE-SEM). The results are shown in FIGS. 4A to 4E.

Figure 4A:
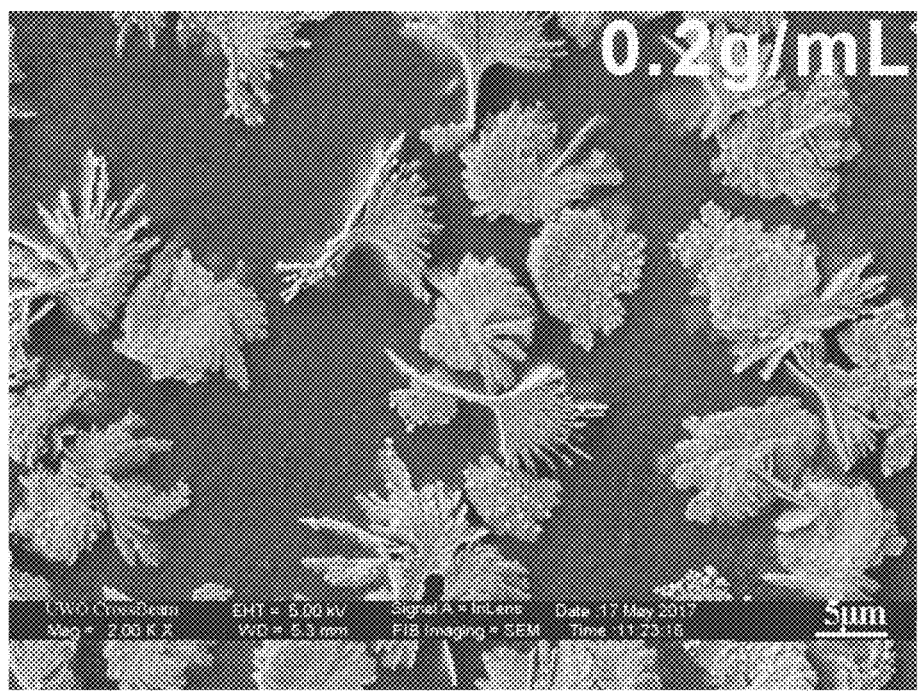
Figure 4B:
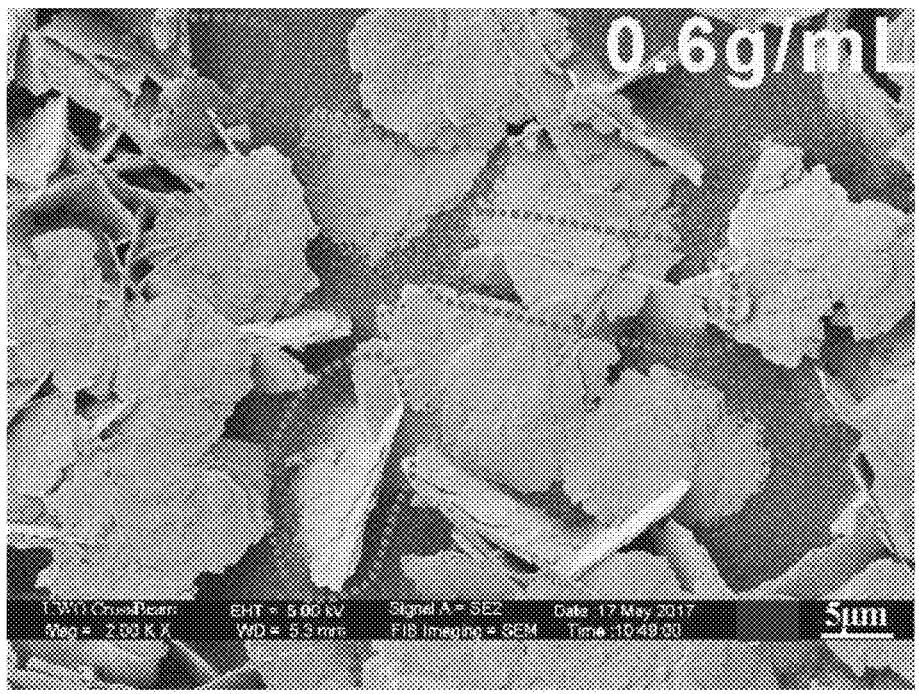
Figure 4C:
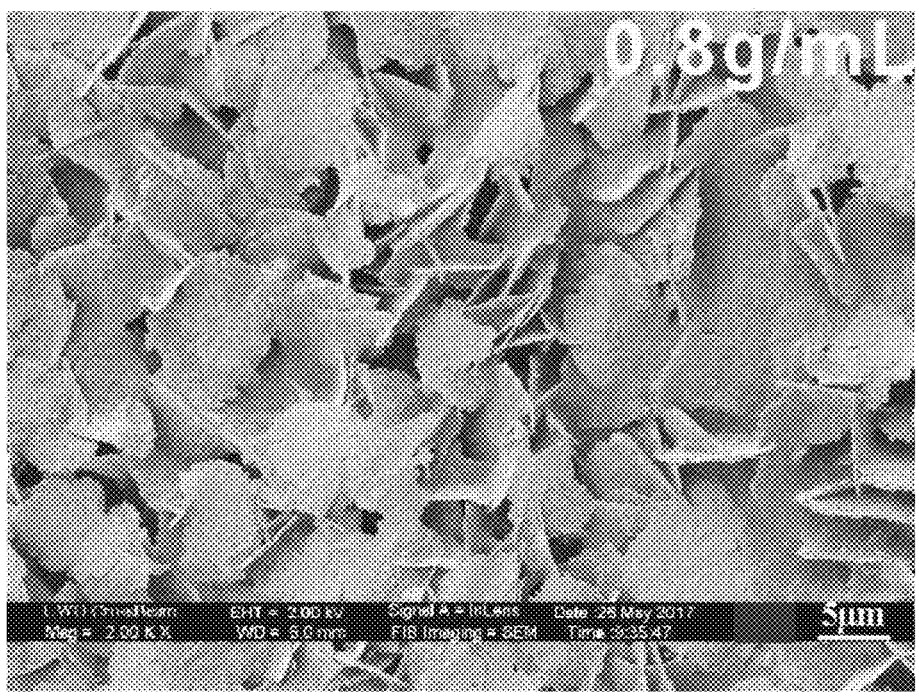
Figure 4D:
Figure 4E:
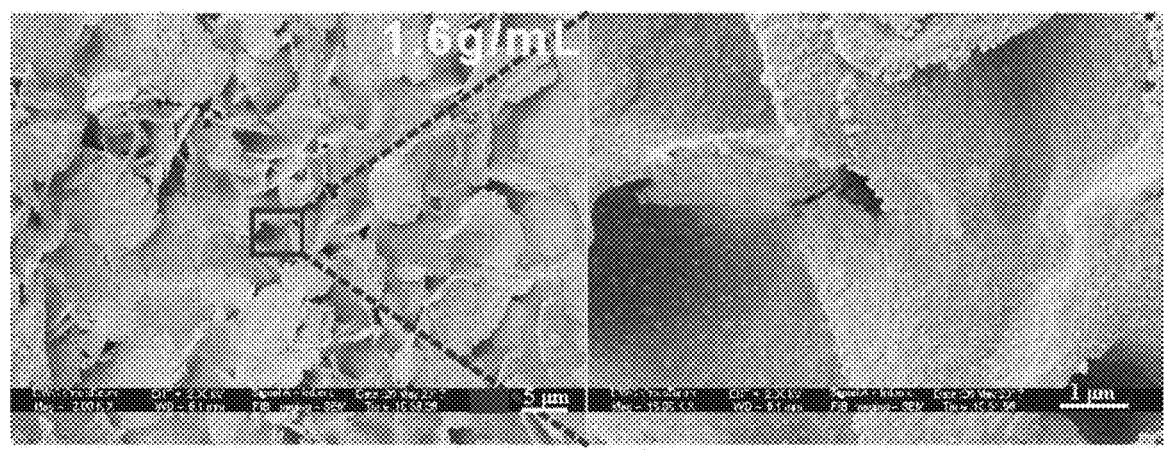

FIGS. 4A to 4E show the surface morphology of single-stroke traces written with 0.2 g/mL, 0.6 g/mL, 0.8 g/mL, 1.2 g/mL and 1.6 g/mL silver nitrate ink respectively. The reduced silver appears to be in the form of small plates with diameters ranging from 5 μm to 10 μm, with small silver particles generated through the secondary nucleation on the surface. The size of the silver plates is much larger than that in commercially available silver ink, which are usually on the nanometer scale. The relatively large silver plates contribute to the good conductivity of the silver trace. At a concentration of 0.2 g/mL, the trace is not conductive (FIG. 3B) since the silver plates are too spread out with minimal contact (FIG. 4A). When the concentration reaches 0.6 g/mL, more silver plates of larger size (~10 μm) are generated, distributing in a random orientation and overlapping with one another, as shown in FIG. 4B. It can be clearly observed that some silver plates are half on the surface, half inside the film (circles by red dot lines in FIG. 4B), illustrating the formation of a three-dimensional silver-polymer structure. The silver plates become denser and thicker with increasing concentration of silver nitrate in the inks, but the morphology remains essentially the same, as shown in FIGS. 4C to 4E. At a concentration of 1.6 g/mL, the silver plates tend to "bond" with each other to form larger plates without gaps. The zoomed in SEM image (FIG. 4E) provides a close look at the boundary of different silver plates, from which we can see that the silver plates seem to "melt" into each other. Expectedly, the trace shows its lowest sheet resistivity of ~3.66 mΩ/sq at this concentration. FIGS. 4F to 4J show the surface morphology of double-stroke traces written with 0.2 g/mL, 0.6 g/mL, 0.8 g/mL, 1.2 g/mL and 1.6 g/mL sliver nitrate ink, respectively. The second stroke was repeated right after the first stroke after an interval of about 5 seconds. The shape of the silver plates is still visible but the morphology appears to be pressed/flattened due to the writing of the second stroke. The growth of the silver plates starts immediately after the first layer of ink is written onto the substrate.

Figure 4F:
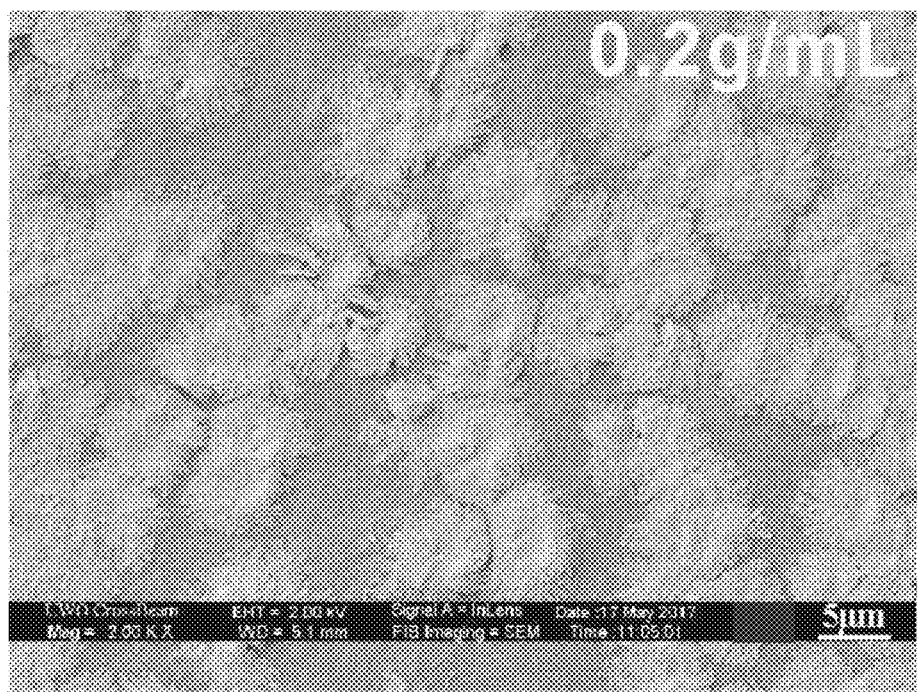
FIGS. 4F to 4J: SEM images of the surface morphologies of double-stroke samples written with different silver nitrate concentration of FIG. 4F: 0.2 g/mL.
Figure 4G:
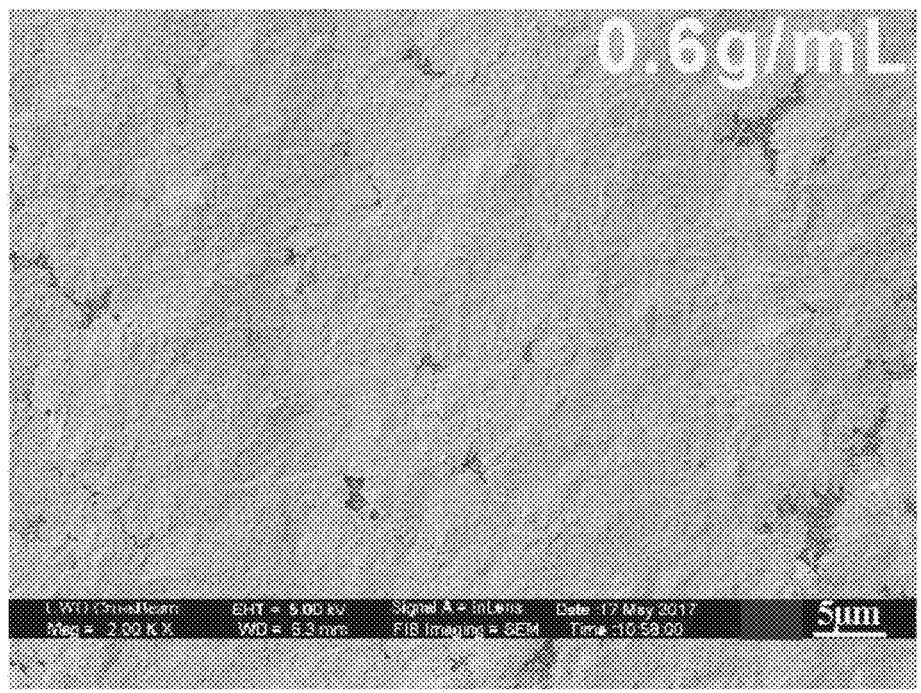
Figure 4H:
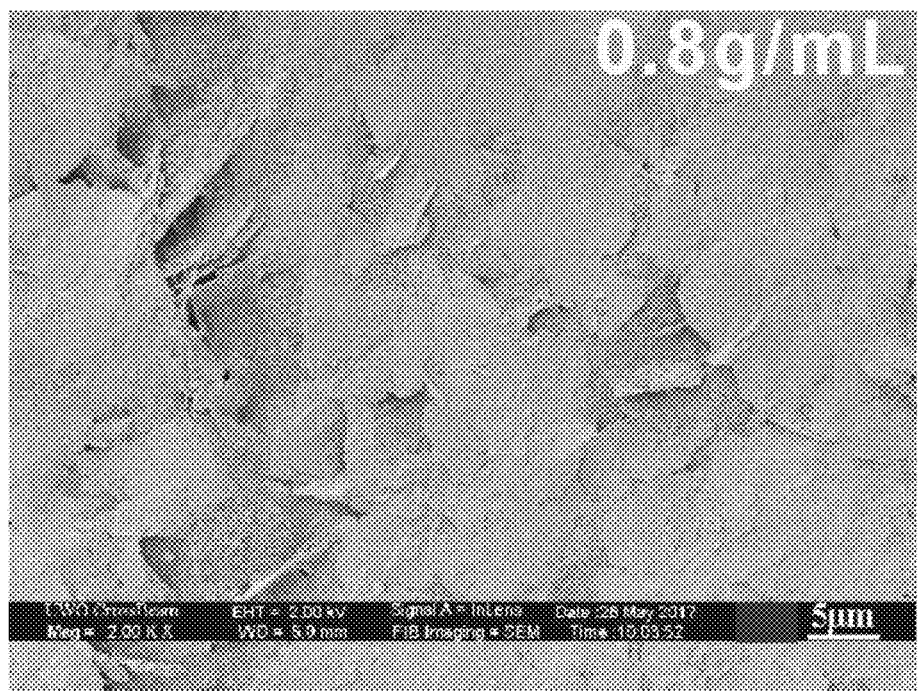
Figure 4I:
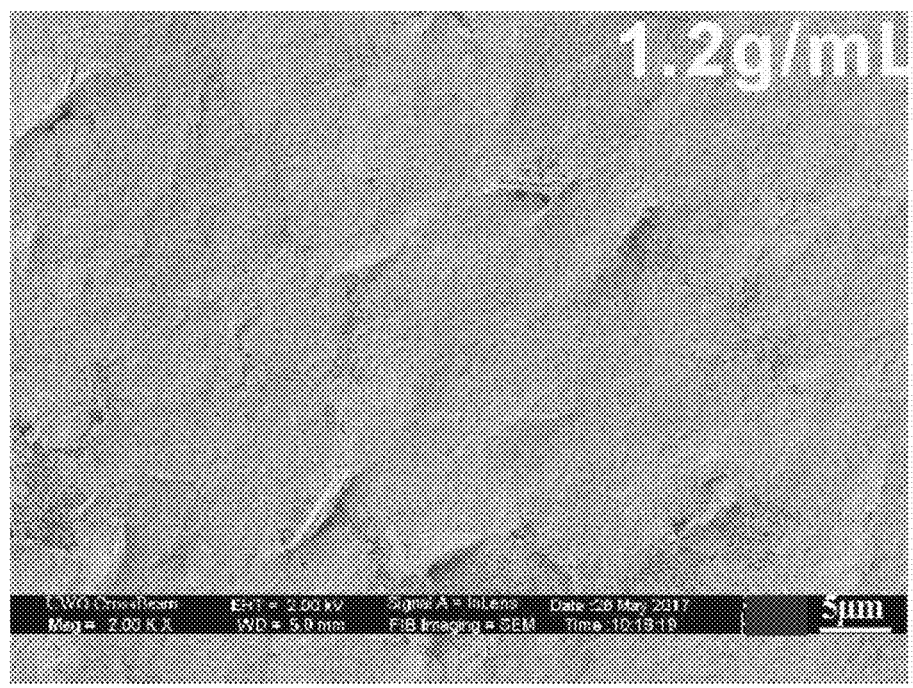
Figure 4J:
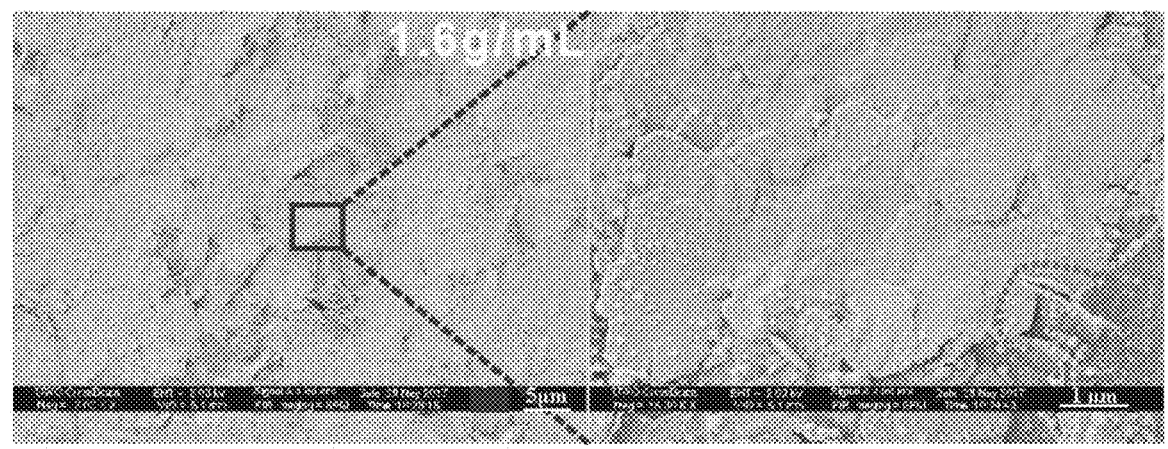

Thus, when we begin writing the second layer, there are already some silver plates on the substrate. Those early generated nucleation centers are pressed when the tips pass by them, forcing them to lay horizontally on the surface. The newly orientated silver plates continue to grow and eventually forms a dense layer of silver metal, as shown in FIGS. 4F to 4G. Due to the horizontally orientated silver plates and larger volume of ink, the sheet resistance is greatly reduced compared to the single-stroke group when the concentration is below 0.7 g/mL (FIG. 3B). We observe the maximum difference in morphologies between single and double-stroke traces at the lowest concentration, 0.2 g/mL. Despite the increased number of overlapped silver plates in the double-stroke trace, many silver nanoparticles are generated and distributed evenly on the substrate, which is reflected by its much lower sheet resistance than that of the single-stroke group at the same concentration. We did not observe any significant changes in the surface morphology of the double-stroke traces after the concentration reached 0.6 g/mL. Though most of the silver plates lay horizontally on the surface, they are still randomly orientated inside the PVA film, as shown in FIG. 4J.

Figure 5A:
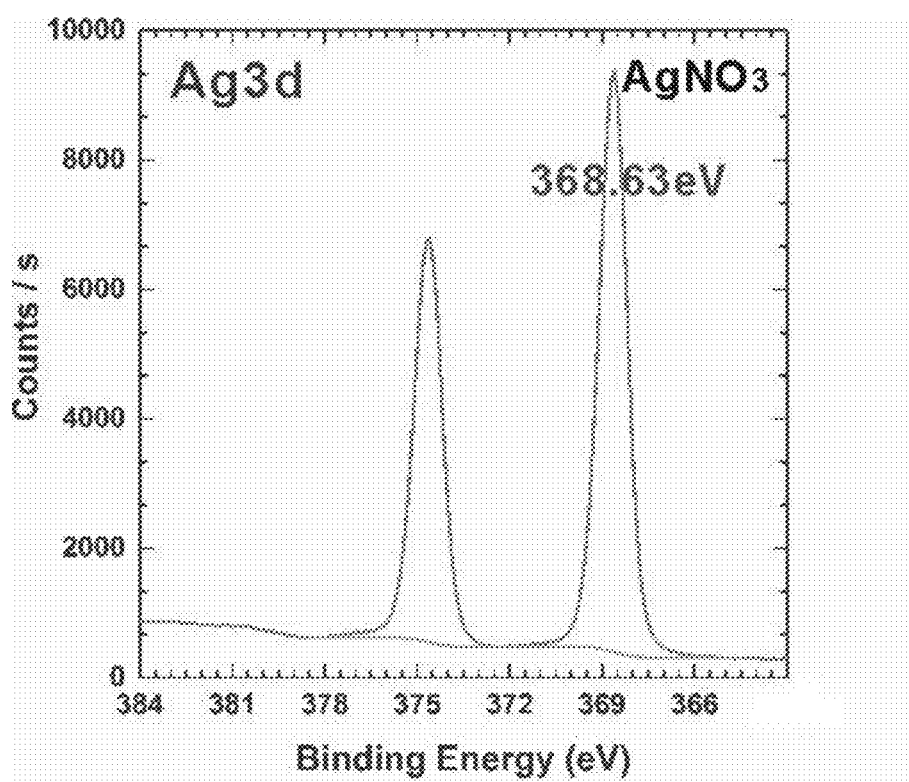
Figure 5B:
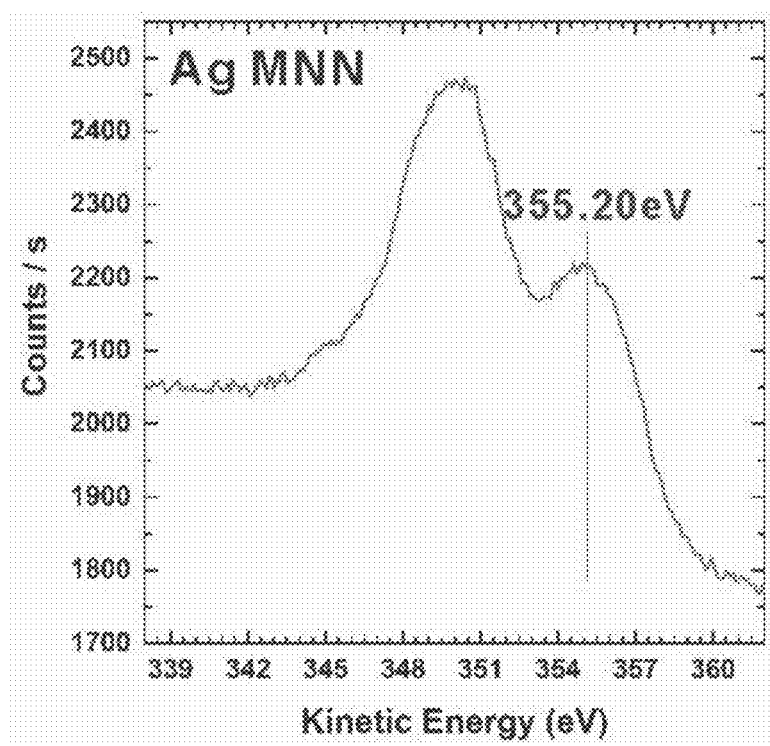
Figure 5C:
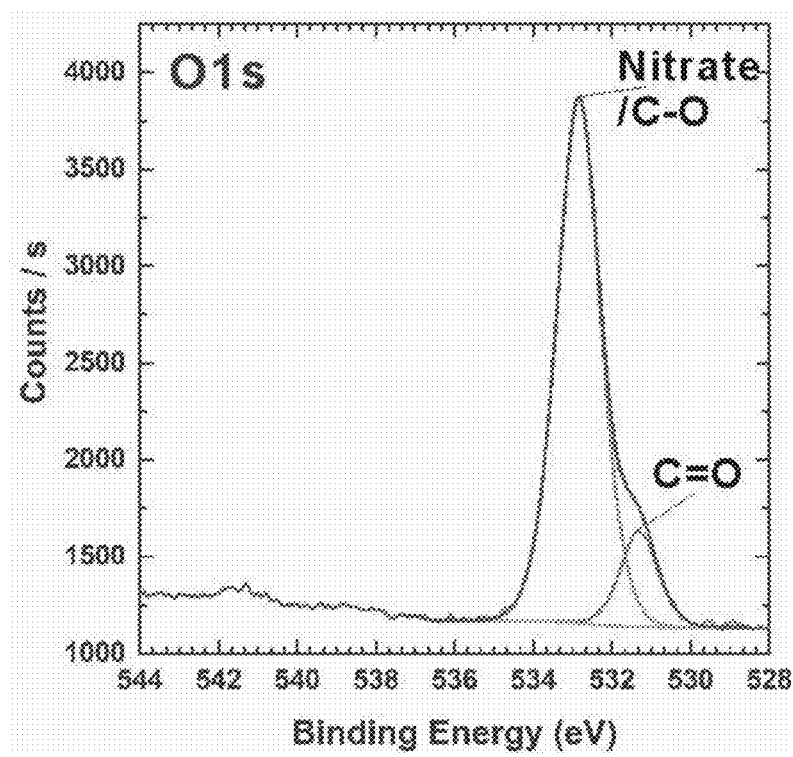
Figure 5D:
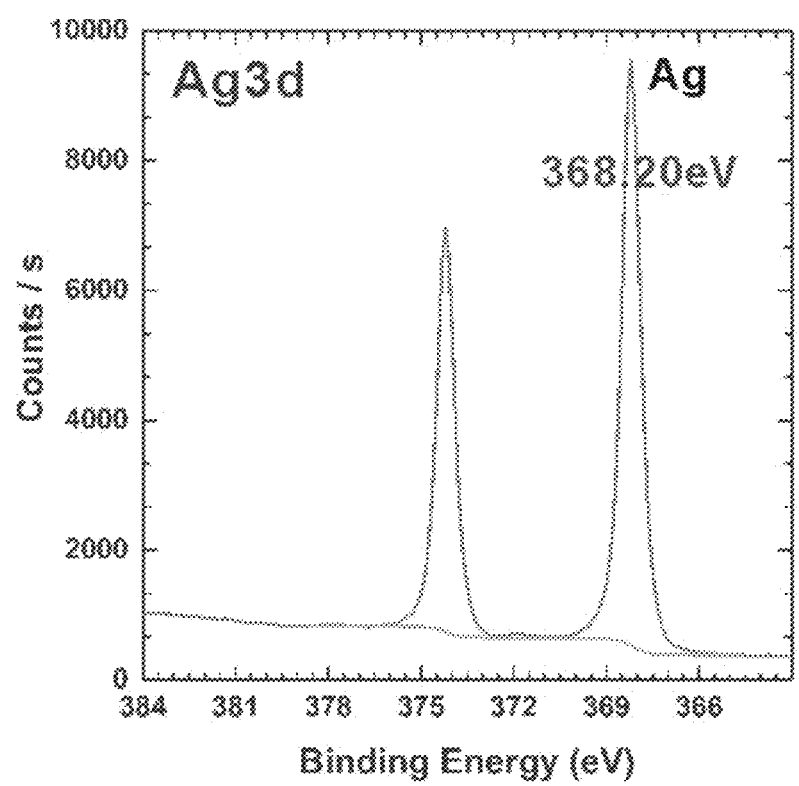
Figure 5E:
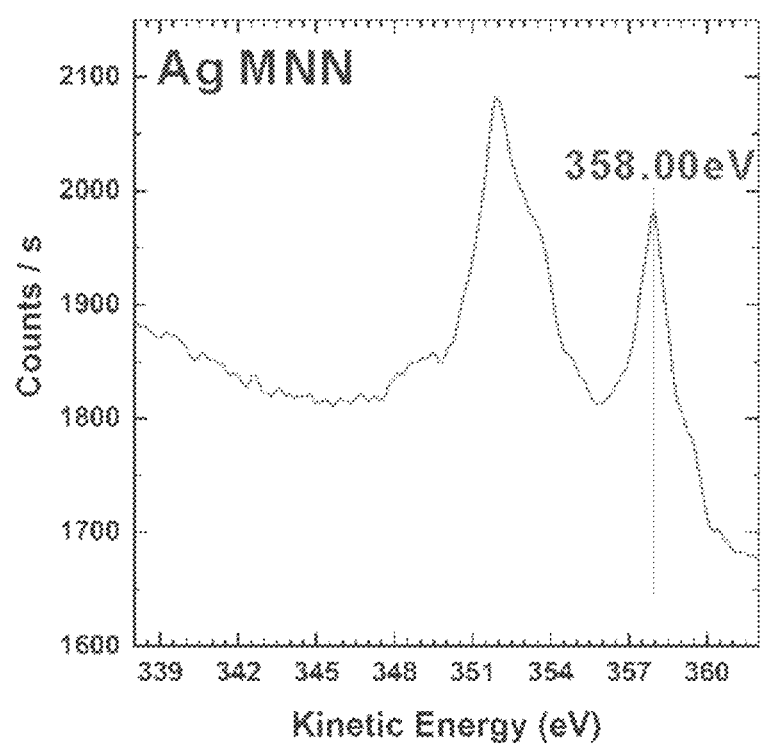
Figure 5F:
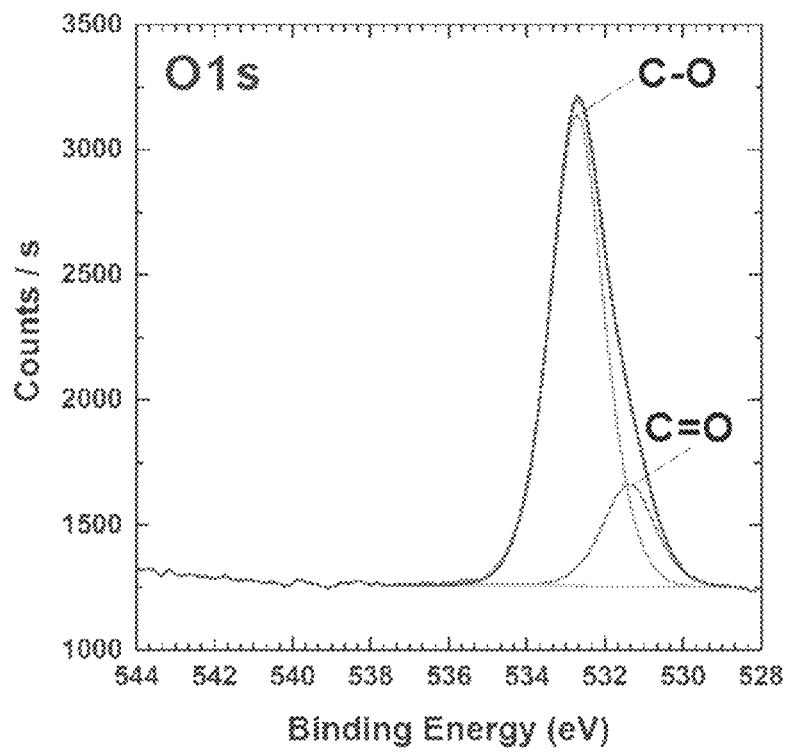

The chemical state of silver on the surface was investigated by X-ray photoelectron spectroscopy (XPS). The binding energy (B.E.) of Ag 3d was calibrated while considering the charge shift observed for the sp3 C—C and C—H bonds that are supposed to be centered at 285 eV. FIG. 5A to 5C show the Ag 3d, Ag MNN and O 1 s regions obtained from a single-stroke trace written with 1.6 g/mL silver nitrate ink on un-activated coating as a control group. Both the Ag 3d peak (368.63 eV, FIG. 5A) and Ag MNN Auger peak (355.20 eV, FIG. 5B) match the silver nitrate standard spectrum, indicating a single chemical state for silver. Combining this with the obtained Auger parameter (723.83 eV), we can confirm that only silver nitrate is presented on the surface. The O 1s region (FIG. 5C presents a strong peak at ~533 eV, which can be attributed to the nitrate groups and PVA film. FIG. 5D to 5F show the same regions obtained from a single-stroke trace, written with the same concentration except on activated coating. Different from the control group, the Ag 3d peak appeared at 368.2 eV and the Ag MNN Auger peak appeared at 358 eV, which matches well with the silver metal standard spectrum.

With an Auger parameter of 726.2 eV, the surface can be confirmed to be covered in silver metal with no presence of other chemical states. Compared to the control group, a slightly larger area of C=O is observed in the O 1s region (FIG. 5F, which can be explained by the newly loaded ascorbic acid. It also worth mentioning that we also conducted an XPS analysis on samples written with higher silver nitrate concentrations, up to 2.0 g/mL. However, the results looked almost identical to those shown in FIGS. 5D to 5F, with silver only present in the $Ag^0$ state.

Figure 6A:
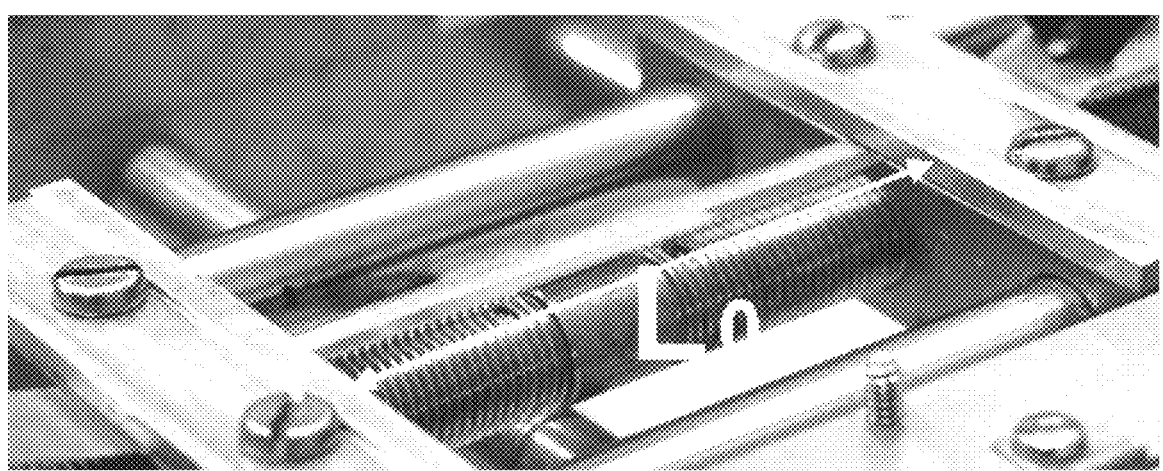
FIGS. 6A to 6I: Optical images of a silver electrode in flat state with initial length of L0 as shown in FIG. 6A; and bent states with length of L as shown in FIG. 6B; and maximum bend radii with Lmin as shown in FIG. 6C. The change of electrical resistance in electrodes written with different silver nitrate concentration with FIG. 6D: single-stroke trace
Figure 6B:
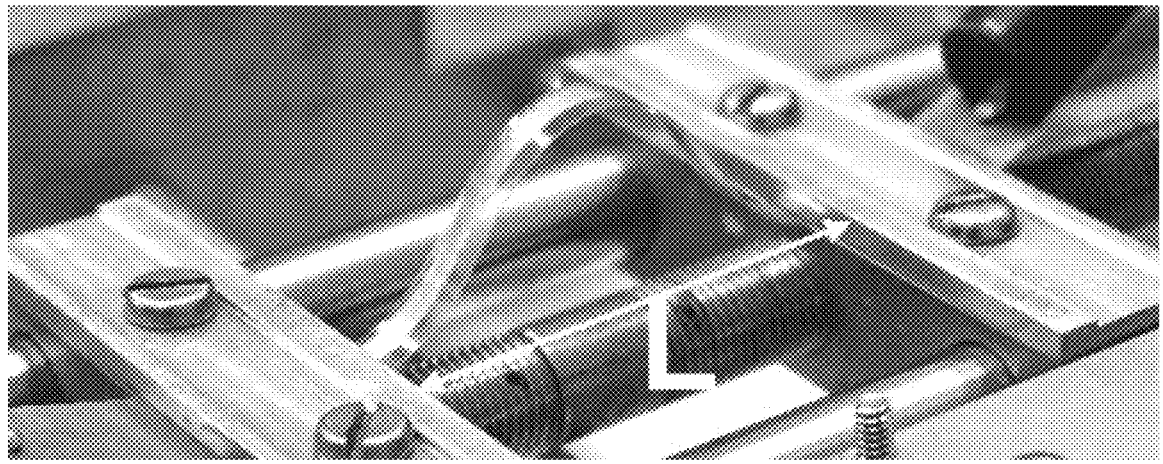
Figure 6C:
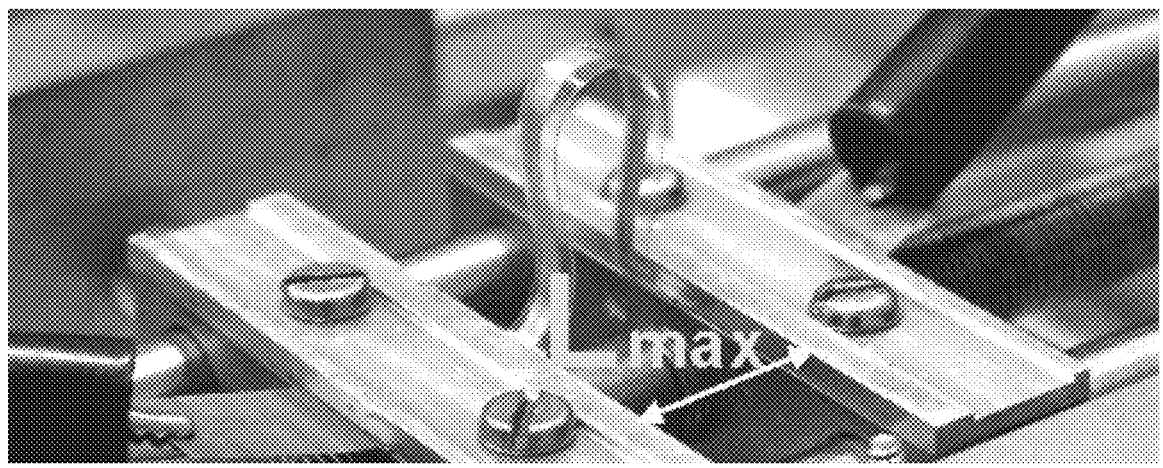
Figure 6D:
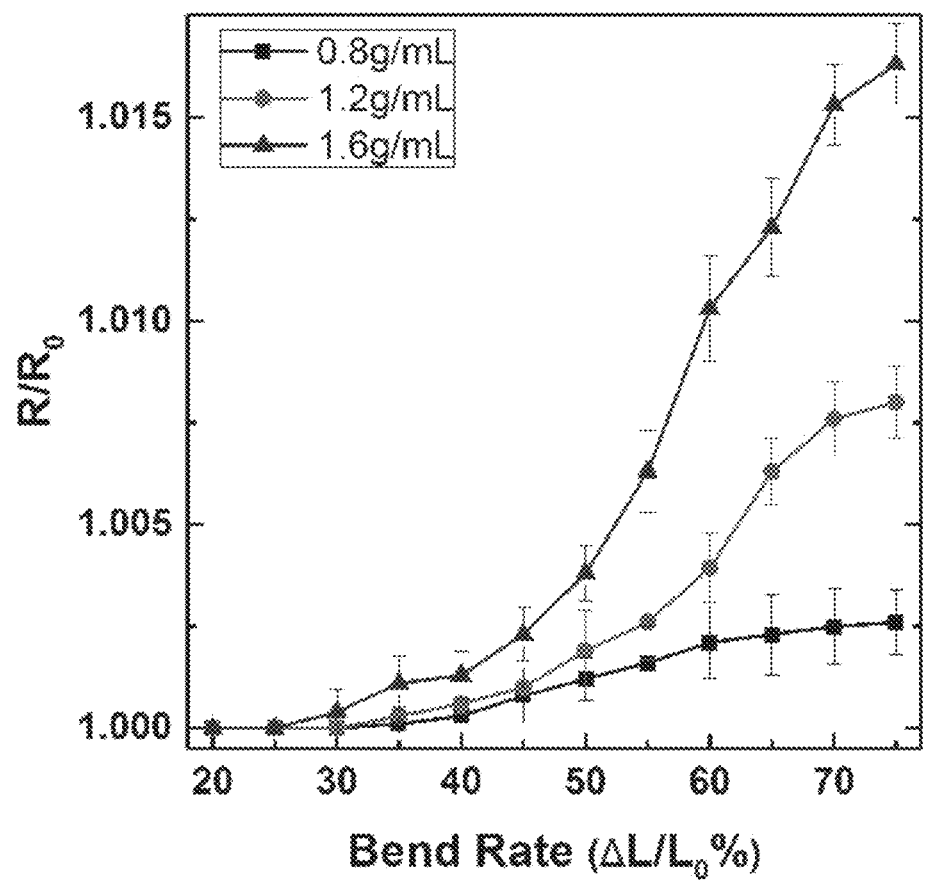
Figure 6E:
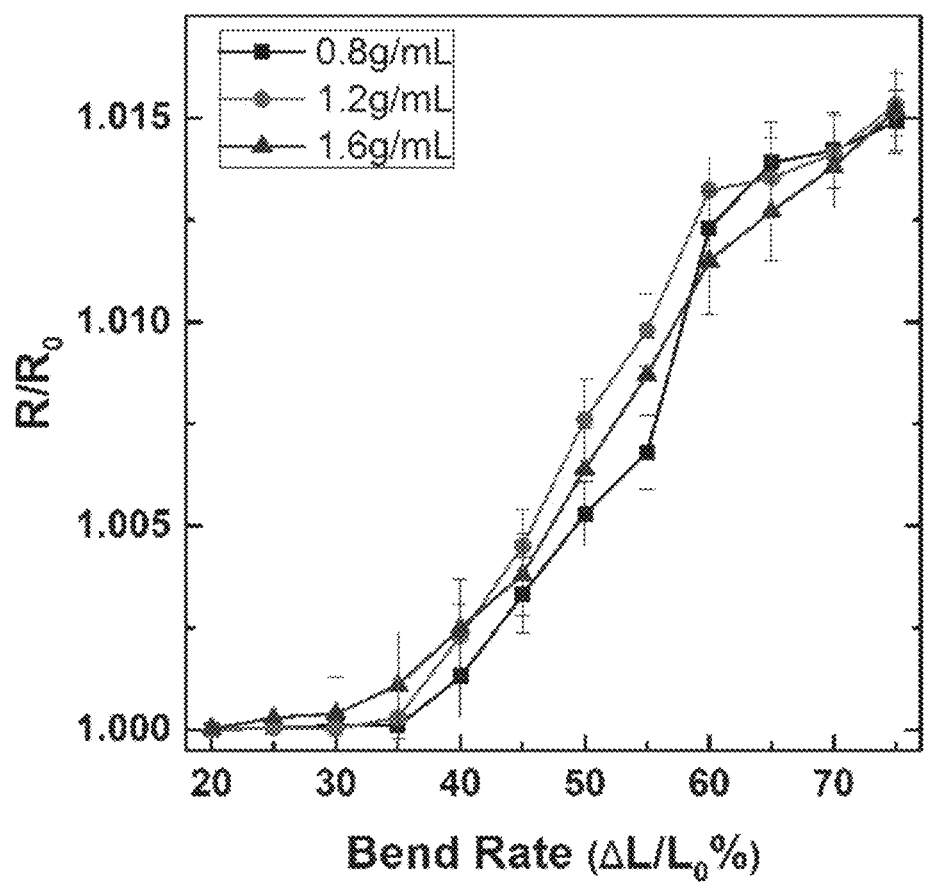
Figure 6F:
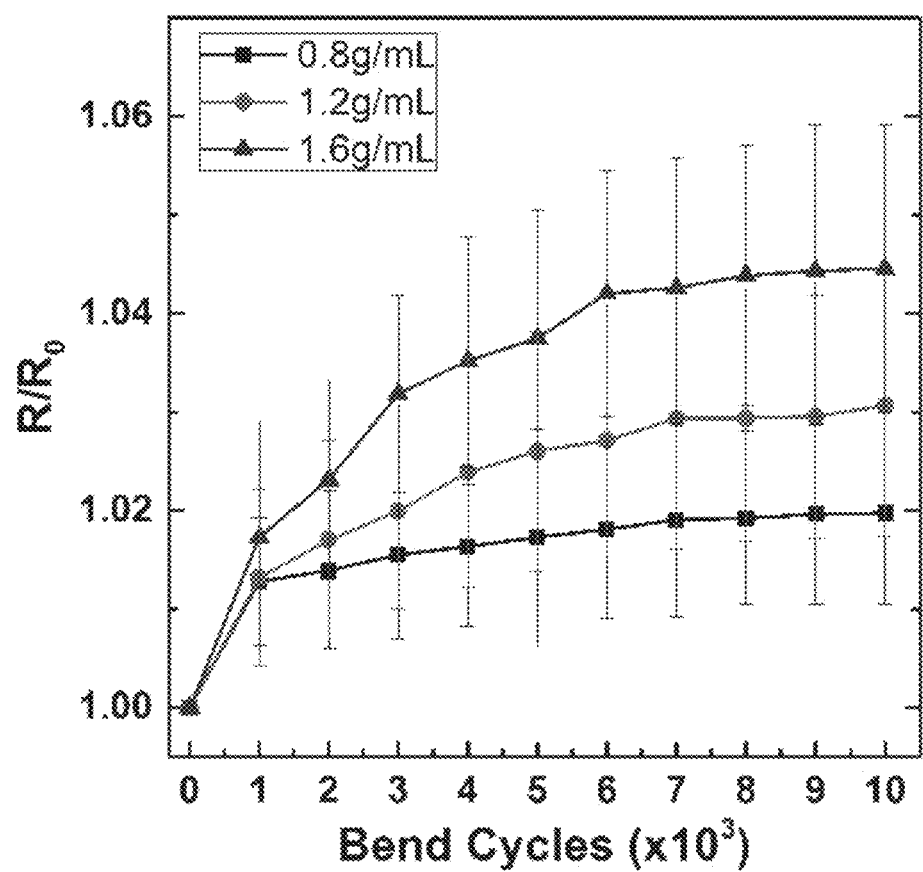
Figure 6G:
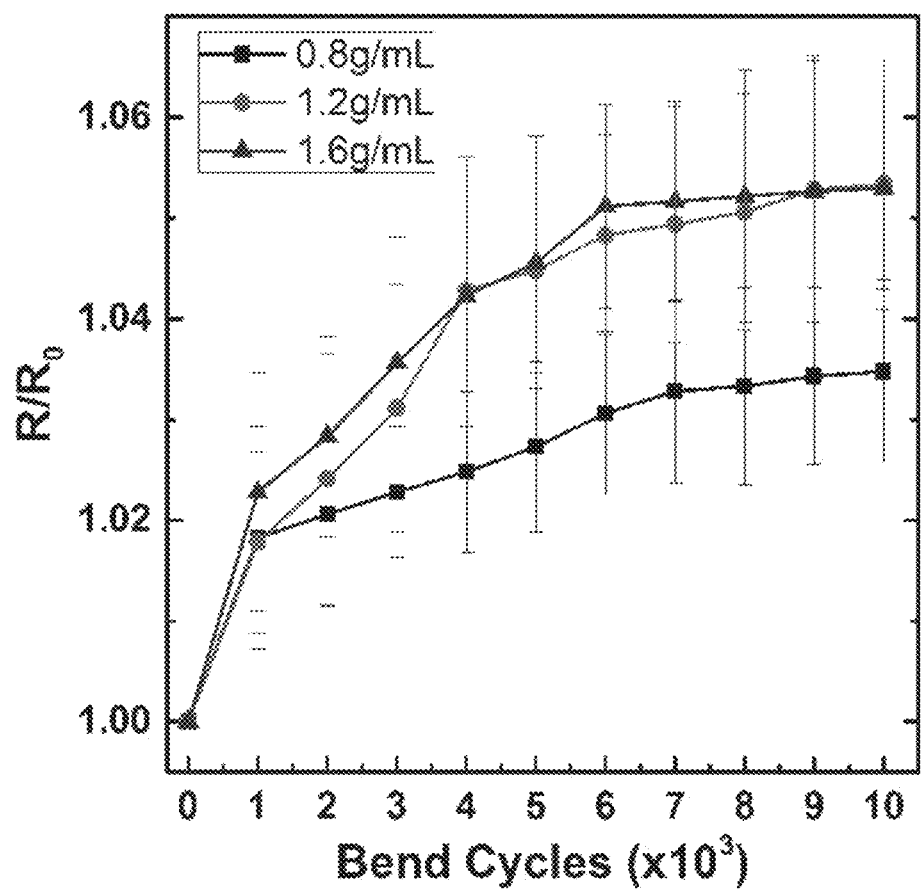

To investigate the mechanical flexibility and stability of the metal-polymer structure, several resistance measurements were conducted. For the bending-resistance tests, traces with length of ~10 cm and width of ~3.5 mm was fabricated on PET substrate using the proposed RoD method. The electrode-patterned PET was actuated between flat and bent states at a rate of 2 cm/s using a custom-made stretching stage connected to a computer-controlled step motor. A Kethley multimeter was connected to the copper electrodes of the stretching stage in a four-probe sensing mode for accurate measurement of the resistance of the sample. FIGS. 6A to 6C shows the tested sample at different bent states. FIG. 6A shows the initial state of the sample with electrode distance of $L_0$. We use the initial distance $L_0$ and actual distance L (shown in FIG. 6B) to calculate the distance difference $\Delta L$ ($L_0$–L), and then divide this value by the initial distance $L_0$ to calculate the "bend rate" ($\Delta L/L_0$%) of the sample. For instance, FIG. 6C displays a specimen with a bend rate of 75% ($L_{min}$=2.5 cm, $L_0$=10 cm). Two groups of data showing the relationship between bend rate and resistance change are presented in FIGS. 6D and 6E, corresponding to the single-stroke and double-stroke traces, respectively. We chose samples fabricated using inks of three different concentrations (0.8 g/mL, 1.2 g/mL and 1.6 g/mL) that gave us satisfactory conductivity. For the single-stroke group, as shown in FIG. 6D, the increasing rate of sheet resistance is positively correlated with the ink concentration, where the 0.8 g/mL trace exhibits the smallest resistance increasing rate of ~0.13% and the 1.6 g/mL trace shows the largest increasing rate of 0.8% at the highest bend rate. The loss of conductivity is mainly attributed to the cracks and separation of silver plates on the PVA surface when bent outwards, and thus samples with a sparser silver layer (lower ink concentration) exhibited smaller increases in resistance. When the bend rate is less than 40%, the resistance is almost unaffected (<0.1%), and even when the bend rate reaches its maximum value (75%), the resistance increment is still smaller than 1%. As for the double-stroke group, as shown in FIG. 6E, the three types of traces show almost identical results, with a near-linear response to the bend rate. This can be explained by their similar surface morphology, as shown in FIGS. 4H to 4J. Similarly, at the maximum bend rate, all samples exhibit a similar resistance increasing rate of ~0.75%. Overall, the silver trances demonstrate excellent conductivity under bending thanks to its unique metal-polymer structure and the good flexibility of PVA film. Flexible electronics are regularly subjected to bending, and its bending durability is an important consideration for its overall performance. Thus, we measured the electrical resistance change of traces written with different ink concentrations as a function of the number of bend cycles, and the average $R/R_0$ values obtained from five traces of each group are presented in FIGS. 6F to 6G corresponding to single-stroke and double-stroke samples, respectively. During the first 1000 cycles, the resistance initially undergoes a large increase, possibly due to newly formed cracks on the surface, but subsequently increases at a much slower steady speed for both groups. For the single-stroke trace, higher concentrations produce larger increases to the resistance as cycles increase. Similar results can be seen in the double-stroke group, with the only difference being that the 1.2 g/mL and 1.6 g/Ml traces appear to be almost identical. After 10000 cycles, all samples exhibit a relatively small resistance change, with a maximum value of ~5% (double stroke, 1.2 g/mL) and minimum value of only ~2% (single stroke, 0.8 g/mL), reflecting superb bending durability. Compared to traditional surface-only conductive features, the bending durability is greatly enhanced by the metal-polymer conductive structure.

Figure 6H:
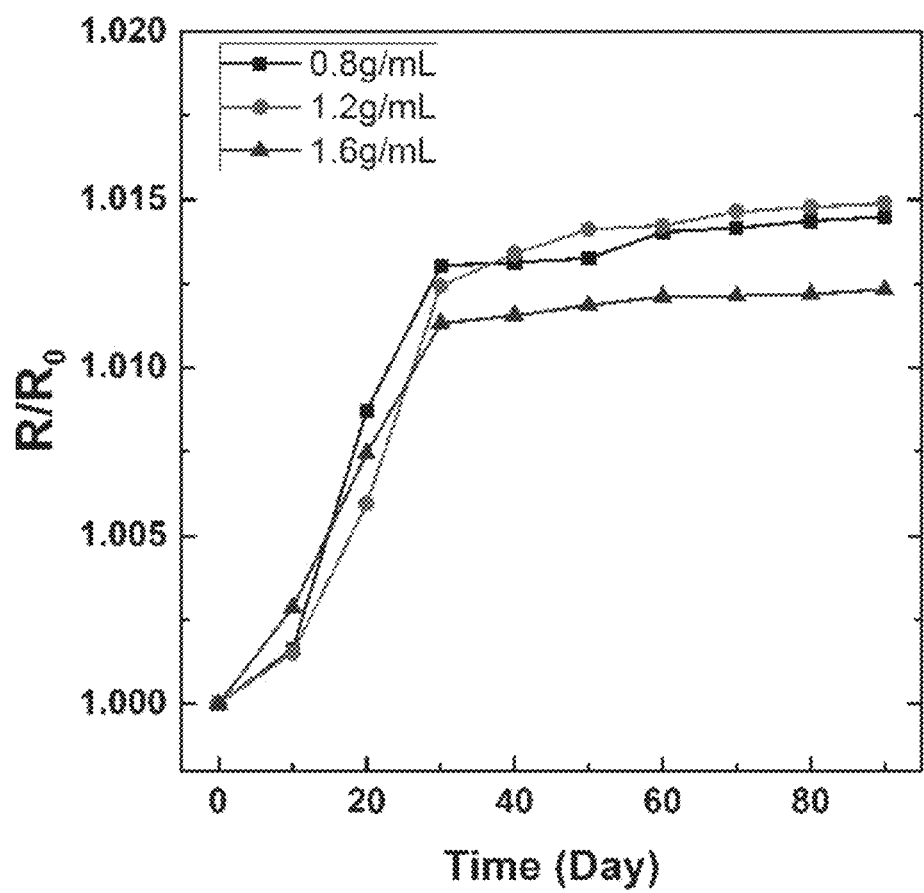
Figure 6I:
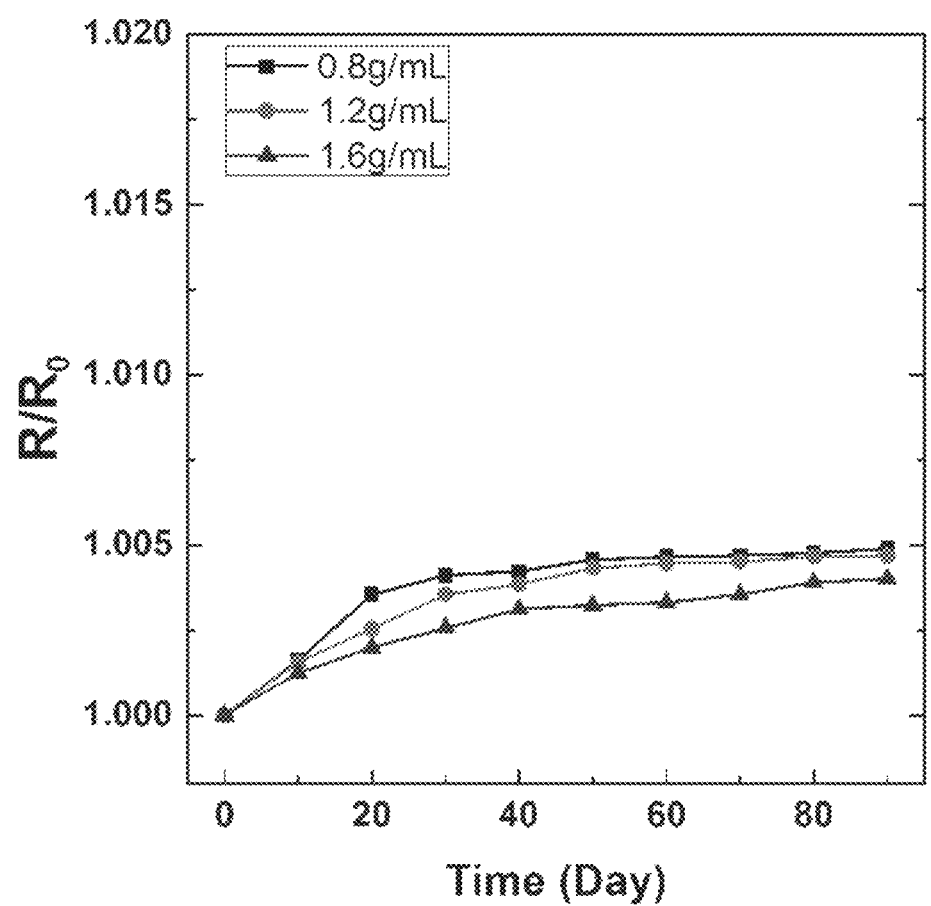

The three-dimensional metal-polymer structure greatly enhances its conductivity, adhesion and durability; however, due to the hydrophilic property of PVA, the silver may have higher risks of being oxidized in air and resultantly lose some conductivity. Hence, the relationship between resistance, ink concentration and storing time was investigated. All samples were left out in open air in a room without any temperature or humidity control. FIGS. 6H and 6I show the resistance change of single-stroke and double-stroke traces, respectively, at different concentrations over a period of 90 days. A steady increase in resistance is observed for the single-stroke group in the first 30 days, after which the resistance remains almost unchanged in the following 60 days after formation of an oxidizing balance. The double-stroke traces exhibit a much better stability over time than that of the single stroke, which may be largely attributed to its dense and pressed morphology. Overall, the single-stroke group shows an average resistance increase of ~1.4%, while the double-stroke group shows an average resistance increase of ~0.4% over a period of three months.

Figure 7A:
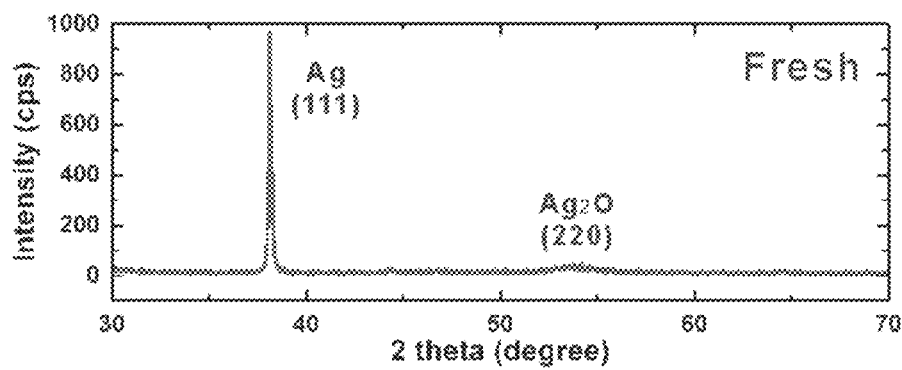
FIG. 7A: X-ray diffraction (XRD) spectra of freshly prepared single-stroke electrode written it 1.2 g/mL silver nitrate ink.
Figure 7B:
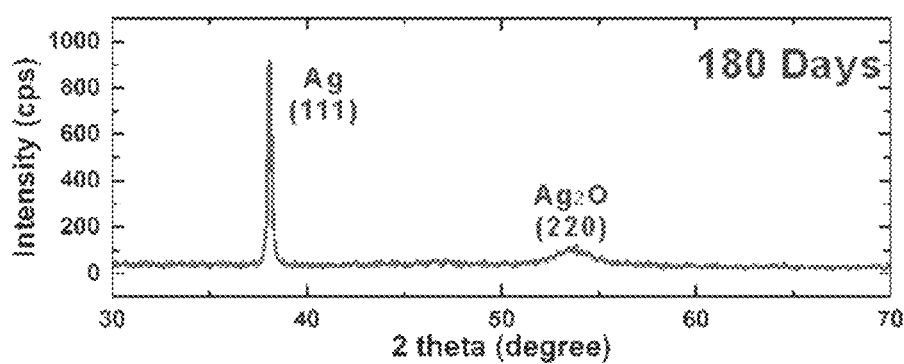
FIG. 7B: X-ray diffraction (XRD) spectra after stored in air for 180 days.

X-ray diffraction (XRD) was conducted to study the crystalline structure of the resultant silver layer and surface metal composition of fresh samples compared to samples stored for 90 days. FIG. 7 presents the XRD patterns of the freshly drawn silver and silver traces stored in air for 90 days. Both samples show peaks at 38.06° and 53.41°, which can be assigned to the silver crystal plane (111) and silver oxide crystal plane (220), respectively (JCPDS Data 04-0783, 41-1104). For the sample stored in air for 90 days, the peak for $Ag_2O$ is slightly stronger than that of the freshly made sample, illustrating that a small amount of oxide is generated over time. Both silver oxide peaks are very weak, and the peaks for (111) silver remain almost unchanged. Thus, we concluded that the samples are relatively stable in dry air over time.

Figure 8A:
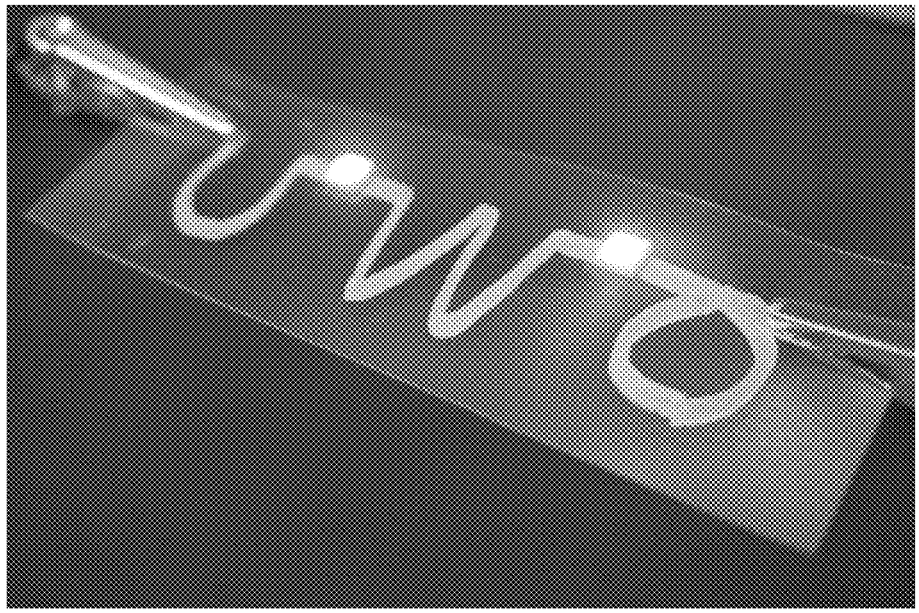
FIG. 8A: Optical images of LEDs powered by the handwritten metal-polymer conductive traces fabricated using the proposed RoD method operating as intended in normal flat state.
Figure 8B:
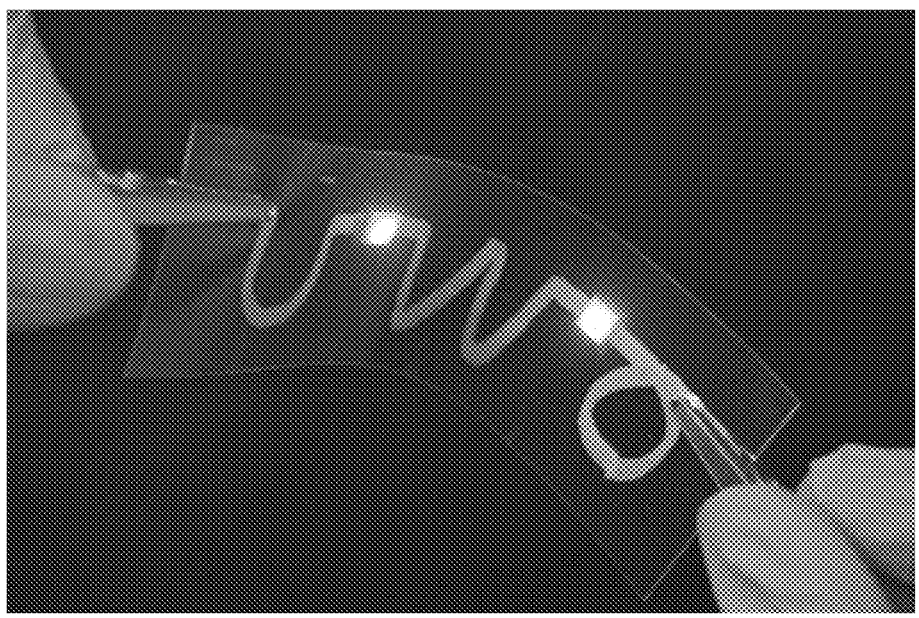
FIG. 8B: when bent inward.
Figure 8C:
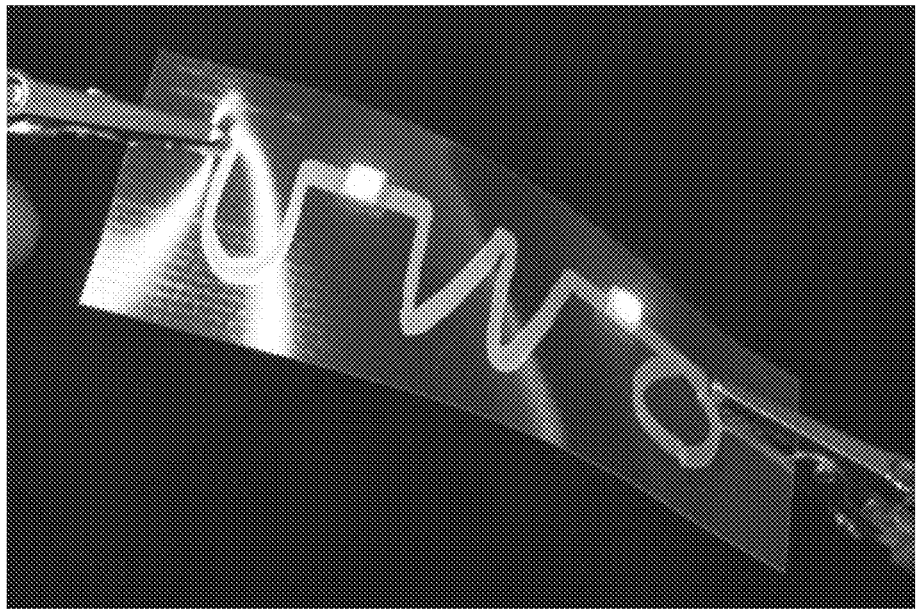
FIG. 8C: when bent outward.
Figure 8D:
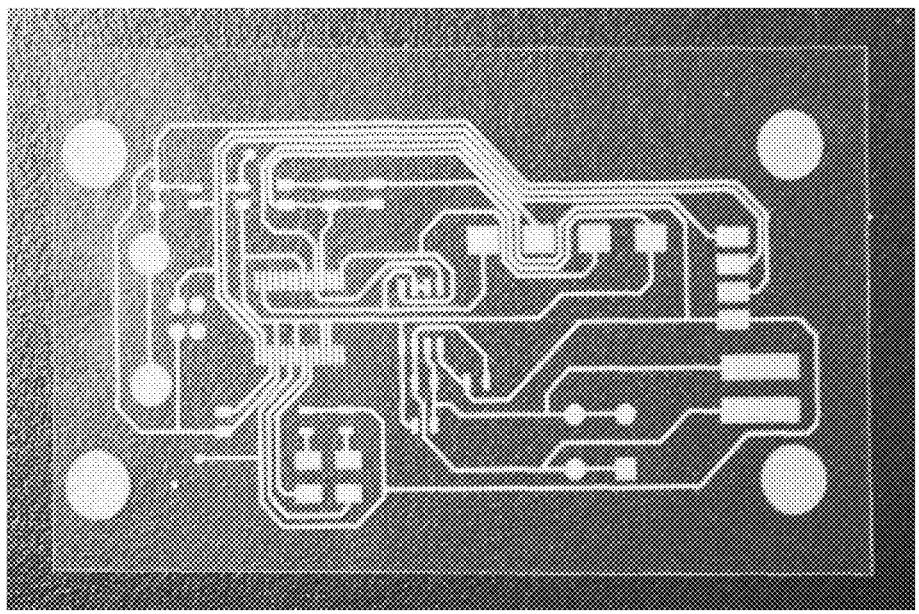
FIGS. 8D, 8E and 8F: Optical images of high resolution functional circuits fabricated by inkjet printing using the RoD method.
Figure 8E:
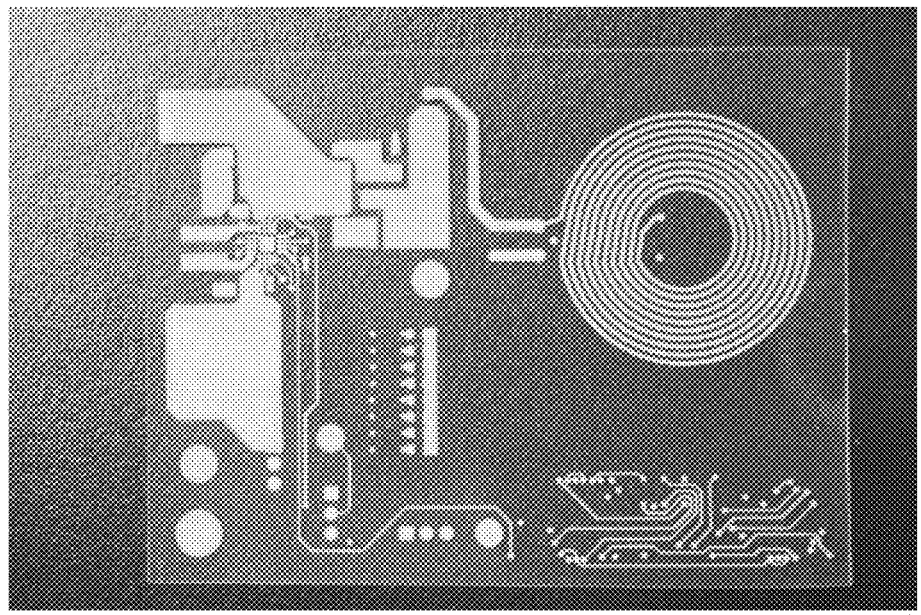
Figure 8F:
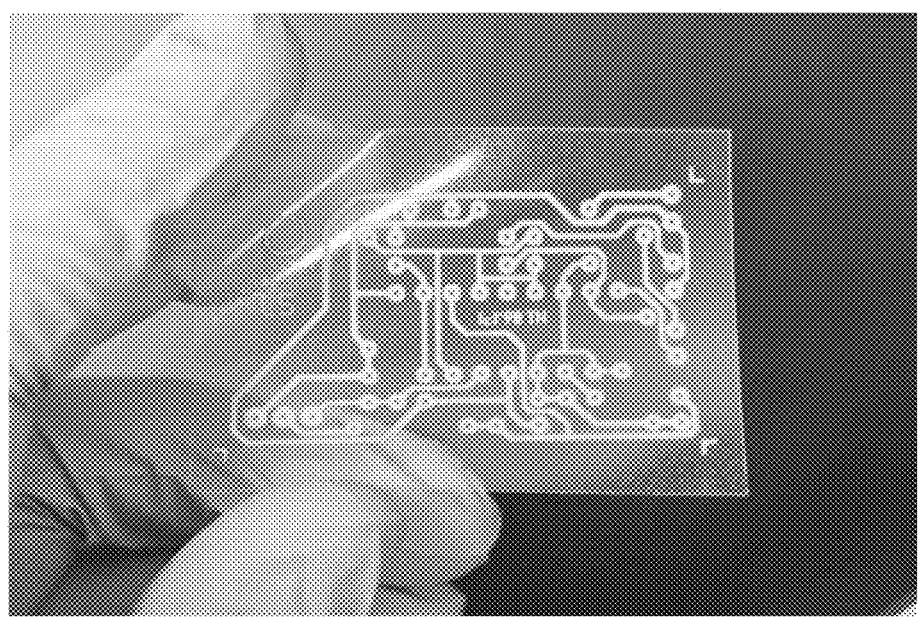

To demonstrate the versatility of the RoD technique in real world applications, we wrote conductive letters on PET and powered two LEDs through the conductive traces, as shown in FIG. 8A. The circuit maintains its function when subjected to inward bending (FIG. 8B) and outward bending (FIG. 8C). With the pen filled with silver nitrate ink, many types of functional circuits can be fabricated within in a few minutes. It is worth mentioning that the RoD method can also be used for manufacturing high performance and high resolution flexible circuit via inkjet printing at ultra-low cost. As a proof of concept, a silver nitrate solution was filled into a commercial available inkjet printer after tuning to the proper viscosity and surface tension. High quality functional circuits can be generated in a few seconds with a single click of "print". FIGS. 8D to 8F shows some of the functional circuits fabricated by RoD based inkjet printing. Since no post-treatment is required for the RoD method, the as-printed circuits can be used immediately for electronic component mounting or deposition of other materials. The RoD approach can also be used in other printing system, such as aerojet printing and gravure printing, to achieve higher resolutions or higher speed of roll-to-roll (R2R) production of high performance flexible electronics.

Example 1

Poly (vinyl alcohol) (PVA) (5 g) was dissolved in DI water (90 mL) with continuous stirring for 72 hours at 85° C., yielding a clear, transparent solution. Xanthan gum (0.1 g) was dissolved in DI water (100 mL) at 70° C. with continuous stirring for 3 hours. After the solution cooling down to room temperature, excessive amount of ascorbic acid was added into the solution followed by gentle stirring for 1 hours. The solution was then filtered with filter paper to remove undissolved ascorbic acid, and after the filtration, we got a transparent, clear solution. Transparent PET film was cleaned by the mixed solution of 1:1 ethanol and acetone in ultrasonic bath for 10 mins, and was air dried at room temperature. InkAID ink absorption coating was applied onto the substrate by a foam brush. After the sample was completely dried in air (about 3 hours), PVA coating was applied onto the substrate as the second layer using foam brush and dried in air. Saturated ascorbic acid solution was then spin coating onto the sample using a Laurell WS-650-23B spin coating at 900 rpm. As the final step, the coated PET was dried in vacuum overnight. Silver nitrate solutions with different silver nitrate concentration were prepared by dissolving specific amount of silver nitrate in DI water. The as-prepared silver nitrate solutions were directly filled into a liquid-ink based marker pen for the following experiment. Silver nitrate solutions with different silver nitrate concentration (0.2 g/mL to 2.0 g/mL) were prepared by dissolving specific amount of silver nitrate in DI water. The as-prepared silver nitrate solutions were directly filled into a liquid-ink based marker pen for the following experiment. Conductive circuits were fabricated by writing the as-prepared ink onto the as-prepared substrate. FIGS. 8A to 8C show the handwritten circuits using the disclosed invention. Materials used: poly (vinyl alcohol) (PVA) (Mw≈40 000, 98-99% hydrolyzed), ascorbic acid (99%), silver nitrate ($AgNO_3$, 99%), xanthan gum (($C_{35}H_{49}O_{29}$)$_n$, 98%) from Sigma-Aldrich; ink absorption coating (clear) from inkAID.

Example 2

Poly (vinyl alcohol) (PVA) (5 g) was dissolved in DI water (90 mL) with continuous stirring for 72 hours at 85° C., yielding a clear, transparent solution. Xanthan gum (0.1 g) was dissolved in DI water (100 mL) at 70° C. with continuous stirring for 3 hours. After the solution cooling down to room temperature, excessive amount of ascorbic acid was added into the solution followed by gentle stirring for 1 hours. The solution was then filtered with filter paper to remove undissolved ascorbic acid, and after the filtration, we got a transparent, clear solution. Transparent PET film was cleaned by the mixed solution of 1:1 ethanol and acetone in ultrasonic bath for 10 mins, and was air dried at room temperature. InkAID ink absorption coating was applied onto the substrate by a foam brush. After the sample was completely dried in air (about 3 hours), PVA coating was applied onto the substrate as the second layer using foam brush and dried in air. Saturated ascorbic acid solution was then spin coating onto the sample using a Laurell WS-650-23B spin coating at 900 rpm. As the final step, the coated PET was dried in vacuum overnight. Silver nitrate solutions with different silver nitrate concentration were prepared by dissolving specific amount of silver nitrate in DI water. The as-prepared silver nitrate solutions were directly filled into a liquid-ink based marker pen for the following experiment. A glycerol-water solution was prepared by mixing anhydrous glycerol and distilled water at a volume ratio of 3:2. Silver nitrate was then added, followed by mixing in a VWR mixer for 4 min to form a 1.2 g/mL silver slat solution. The prepared ink was degassed in a vacuum chamber at 2 psi for 2 h to remove dissolved gases and bubbles. The viscosity and surface tension of the final ink were 12.3 cp and 50.1 mN m$^{-1}$, respectively. These values fall within the optimum operating range for the Dimatix DMP-2800 printer. A 0.2 µm nylon syringe filter was used to remove undesired particles from the ink. The ink was filled into a cartridge mounted on a 10 pL piezoelectric drop-on-demand inkjet print head. Printing parameters were set as following: drop space, 15 µm; meniscus vacuum, 3.5 in. of $H_2O$; print head temperature, 25° C.; print head angle: 2.1°; jetting voltage ~25.1 V. Printing was conducted at room temperature. High conductive circuits were printed by inkjet printing the as-prepared silver nitrate ink onto the as-prepared substrate. FIGS. 8D to 8F show the inkjet printed circuits using the method disclosed in this invention. Materials used: poly (vinyl alcohol) (PVA) (Mw≈40 000, 98-99% hydrolyzed), ascorbic acid (99%), anhydrous glycerol ($C_3H_5(OH)_3$, 99%), silver nitrate ($AgNO_3$, 99%), xanthan gum (($C_{35}H_{49}O_{29}$)$_n$, 98%) from Sigma-Aldrich; ink absorption coating (clear) from inkAID.

The invention claimed is:

1. A react-on-demand (RoD) method of fabricating a three-dimensional electrically conductive hybrid metal-polymer structure on a substrate, the method comprising:
   (i) coating the substrate with an ink-absorption coating to form an ink absorption layer on the substrate, followed by
   (ii) coating the substrate with polyvinyl alcohol (PVA) solution to form a PVA layer having PVA polymers on the ink absorption layer, followed by
   (iii) functionalizing the PVA layer with a first solvent containing a reducing agent and evaporating the first solvent to induce formation of crystals of the reducing agent located in between polymer chains of the PVA polymers as well as on the surface of the PVA layer, followed by
   (iv) printing or writing a second solvent containing water and a metal salt onto the PVA layer wherein the second solvent dissolves the reducing agent and at the same time the reducing agent reduces the metal salt to produce metal particles to form a three-dimensional electrically conductive hybrid metal-polymer structure in which the metal particles are located on the surface of the PVA layer as well as in between the polymer chains in an interior of the PVA layer.

2. The method of claim 1, wherein the substrate is a flexible substrate and the substrate is any one of polyimide (PI), polyethylene terephthalate film (PET), polyethylenimine (PEI), polydimethylsiloxane (PDMS) and paper.

3. The method of claim 1, wherein the substrate is a rigid substrate and the substrate is any one of FR-4, Polyvinyl chloride (PVC), acrylonitrile butadiene styrene (ABS) and polylactic acid (PLA).

4. The method of claim 1, wherein the PVA polymers of the PVA layer have a molecular weight in a range from 40,000 g/mol to 100,000 g/mol.

5. The method of claim 1, wherein the concentration of the PVA solution is in a range from 10% to 30% w/v % in water.

6. The method of claim 1, wherein the coating method of coating with said ink-absorption coating and with said polyvinyl alcohol (PVA) solution is any one of spin coating, dip-coating, spray coating and printing.

7. The method of claim 1, wherein the reducing agent is one of ascorbic acid and glucose.

8. The method of claim 1, wherein in the first solvent the concentration of the reducing agent is in a range from 20% to 30% w/v %.

9. The method of claim 1, wherein the printing method is any one of inkjet printing, gravure printing, off-set printing, aerosol jet printing and screen printing.

10. The method of claim 1, wherein the metal salt is silver nitrate.

11. The method of claim 1, wherein the concentration of the metal salt is in a range from 0.2 g/mL to 2.0 g/mL.

* * * * *